United States Patent [19]

Waga et al.

[11] Patent Number: 5,529,831

[45] Date of Patent: Jun. 25, 1996

[54] THIN FILM DEVICE

[75] Inventors: Satoshi Waga; Mitsuo Bitoh, both of Sendai; Kazunari Takida, Nagaoka; Kenji Shimizu, Miyagi-ken; Kiyoshi Sasai, Miyagi-ken; Yoshihiro Sudoh, Miyagi-ken; Yoshinobu Kakihara, Sendai, all of Japan

[73] Assignee: Alps Electric Co., Ltd., Tokyo, Japan

[21] Appl. No.: 349,155

[22] Filed: Dec. 2, 1994

[30] Foreign Application Priority Data

Dec. 9, 1993 [JP] Japan ..................... 5-340765

[51] Int. Cl.⁶ ..................... B32B 9/00
[52] U.S. Cl. ..................... 428/209; 428/615; 428/620; 428/901; 360/126; 360/130.23; 360/130.32
[58] Field of Search ..................... 360/126, 130.32, 360/130.23; 428/210, 209, 615, 620

[56] References Cited

U.S. PATENT DOCUMENTS

| | | | |
|---|---|---|---|
| 4,024,489 | 5/1977 | Bajorek et al. | 428/210 |
| 4,819,112 | 4/1989 | Iwata et al. | 360/126 |
| 4,819,113 | 4/1989 | Kubota et al. | 360/126 |
| 5,031,063 | 7/1991 | Hasegawa | 360/126 |
| 5,287,237 | 2/1994 | Kitada et al. | 360/126 |
| 5,302,469 | 4/1994 | Sugenoya et al. | 428/900 |
| 5,431,987 | 7/1995 | Ikeda | 428/210 |

OTHER PUBLICATIONS

"A Study on Arranged Spiral Coil Type Inductor" from *Papers of Technical Meeting* (Meeting on Magnetics), published on Jan. 20, 1992; Editor: The Institute of Electrical Engineering of Japan.

*Primary Examiner*—Patrick J. Ryan
*Assistant Examiner*—Kam F. Lee
*Attorney, Agent, or Firm*—Guy W. Shoup; Patrick T. Bever

[57] ABSTRACT

A thin film device comprising a substrate which is magnetic and has insulation property at least on the surface, coils formed spirally in a planar configuration on the substrate, a first interlayer insulation film formed to a portion excepting for the terminal portion of the coils and a magnetic material connection portion of the substrate, a magnetic film and a second interlayer insulation film formed successively on the first interlayer insulation film excepting for the terminal portions, and bump electrodes formed in connection with the terminal portions in which a crystallite material having a composition: $Fe_{78}Ta_{10}C_{12}$ is used as the magnetic film. The thin film device can be formed an a reduced size and having a large inductance value. When the device is used as a noise filter, a cut-off frequency range can be lowered.

3 Claims, 15 Drawing Sheets

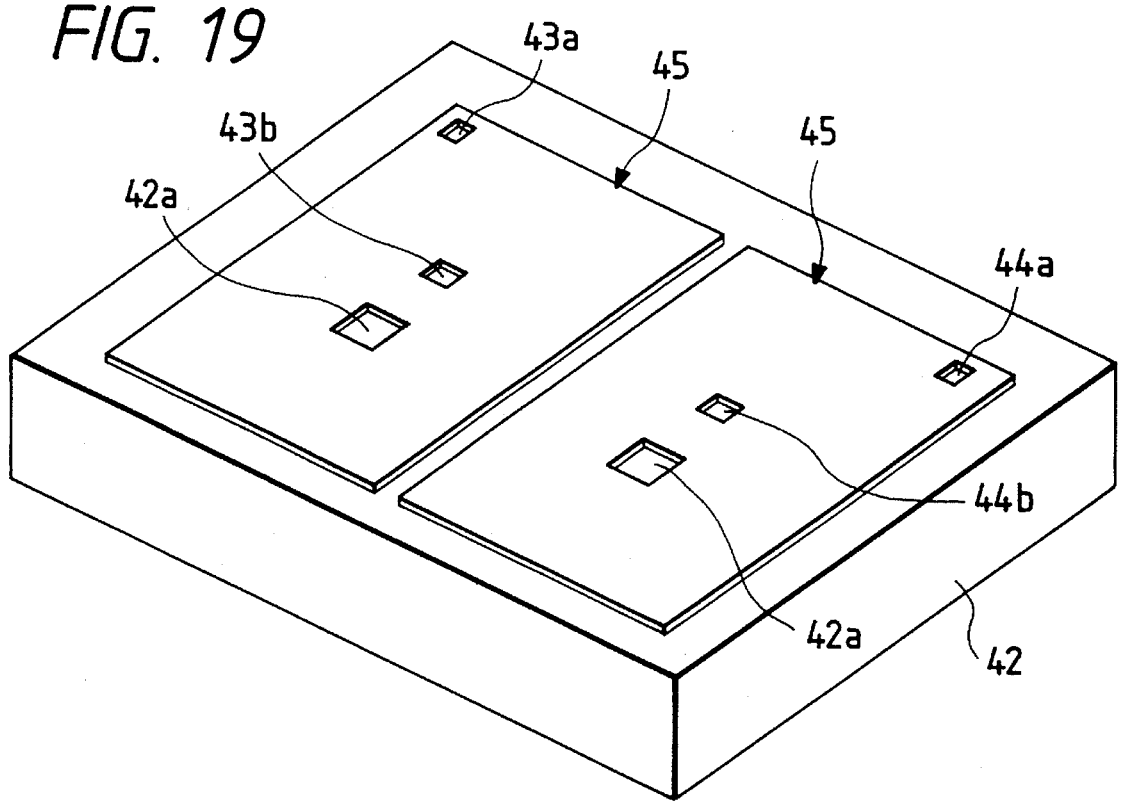
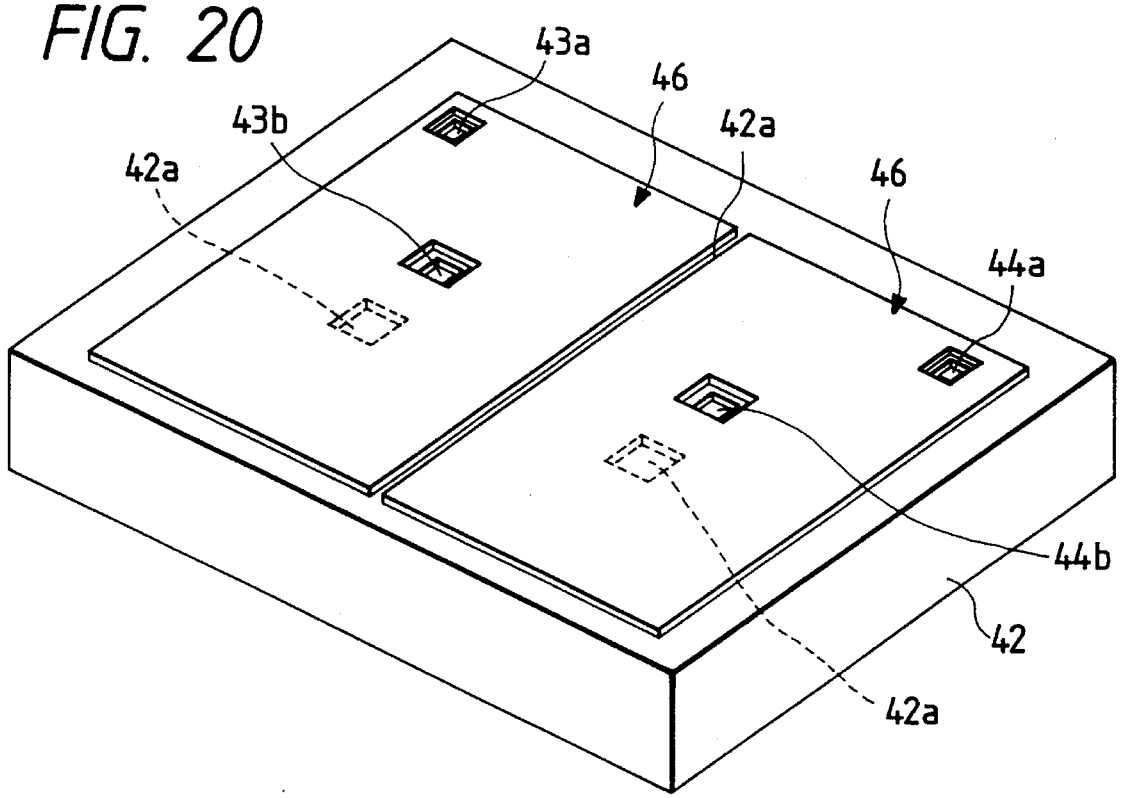

THIN FILM DEVICE

BACKGROUND OF THE INVENTION

1. Field of the Invention

The present invention concerns a thin film device of an inductor or L-C constitution which is used, for example, as a noise filter in a digital circuit and, more in particular, it relates to a thin film device attaining a high inductance by using a magnetic film having a high saturation magnetic flux density and a high permeability.

2. Description of the Prior Art

FIG. 27 is a perspective view illustrating a constitution of a dual layered spiral coil type thin film inductor in the prior art and FIG. 28 is a cross sectional view thereof.

In a thin film inductor 1 shown in FIGS. 27 and 28 a lower layer magnetic core 3 is formed on a substrate 2, and a first insulation film 4, a lower layer coil 5, a second insulation film 6, an upper layer coil 7 and a third insulation film 8 are laminated on the lower layer magnetic core 3. Then, an upper layer magnetic core 9 is disposed covering the insulation films 4, 6, 8 and the coils 5, 7 and in contact with the lower layer magnetic core 3.

FIG. 29(A) is an upper plan view of a magnetic thin film L-C filter and FIG. 29(B) is a cross sectional view thereof and FIG. 29(C) is a cross sectional view for the coil layer.

In the thin film L-C filter 11 shown in FIG. 29, a magnetic thin film inductor 12 and a thin film capacitor 13 are coupled by means of a conductor.

As shown in FIG. 29(C), the magnetic thin film inductor 12 comprises a magnetic thin film 14b and a conductor thin film 14a laminated successively on the substrate 2 in which the laminated films are formed into a planiform coil pattern. Further, the thin film capacitor 13 comprises a lower electrode 15 formed on the substrate 2, a dielectric film 16 laminated on the lower electrode 15 and an upper electrode 17 formed on the dielectric film 16. The thin film inductor 12 and the upper electrode 17 are conductively connected.

In the dual layered spiral coil type thin film inductor 1 or the thin film L-C filter 11 having the above constitution, the magnetic film has been formed so far with a permalloy (Fe-Ni system) or a Co system amorphous material in the prior art, and a saturation magnetic flux density of the magnetic material is about 1 T (Tesla). Further, the thickness of the thin film of the magnetic material in the thin film device is limited to about 1 um, the outer profile of the upper and lower magnetic cores 3, 9 or the magnetic material 14b is a rectangular shape having about 2 to 4 mm size for each one side.

In a case of constituting an inductor by forming the magnetic film having the thickness and the planiform described above by the magnetic material having the saturation magnetic flux density as described above, the inductance value is limited to about 0.1 uH. Accordingly, when the L-C filter containing the inductor is formed, the frequency for the circuit operation is in a relatively high band as 10 MHz to 100 MHz and it can not function sufficiently as a noise filter to noise components at a lower frequency.

Further, since a material of relatively low saturation magnetic flux density is used as the magnetic material, the area of the magnetic film has to be increased in order to increase the inductance value in the inductor. Accordingly, the outer size of the thin film device is increased and, further, when the magnetic material is formed into a film of a large area by vapor deposition process or the like, no high accuracy of the film thickness can be ensured.

OBJECT OF THE INVENTION

It is an object of the present invention to overcome the foregoing problems in the prior art and provide a thin film device capable of constituting an inductor of a high inductance value and capable of constituting an L-C device which can operate at a low frequency, by using a magnetic film having a high saturation magnetic flux density and a high permeability.

SUMMARY OF THE INVENTION

The foregoing object can be attained in accordance with a first aspect of the present invention by a thin film device comprising, on a substrate, a coil layer of a planiform, a magnetic film formed on the conductor layer by way of an insulation layer, and terminal portions formed to the coil layer, and the conductor layer.

In a second aspect of the present invention, there is provided a thin film device comprising, on a substrate, a coil layer of a planiform, a dielectric layer and a conductor layer laminated on the coil layer, a magnetic film formed by way of an insulation layer on the conductor layer, and terminal portions formed to the coil layer and the conductor layer.

In a third aspect of the present invention, there is provided a thin film device comprising, on a substrate, a coil layer of a planiform, a magnetic layer formed on the coil layer by way of an insulation layer, a first conductor layer formed by way of an insulation layer on the magnetic layer and is conducted with the coil layer, a second conductor layer formed by way of the dielectric layer on the first conductor layer, and terminal portions formed to the coil layer and the second layer.

In the device in any of the above-mentioned aspects, the magnetic layer is made of an Fe-M-C system crystallite material in which Fe represents iron, M represents a metal belonging to the group: IVb, Vb or VIb and C represents carbon.

The first aspect constitutes a thin film inductor having a planiform coil layer formed on a substrate, the second aspect constitutes a distributed constant thin film L-C device in which the dielectric layer is formed between the coil layer and the conduction layer and, further, the third aspect constitutes a lumped constant thin film L-C device in which the dielectric layer is formed between the first conductor layer in conduction with the coil layer and second conduction layer.

In any of the aspects of the present invention, the magnetic layer covering the coil layer is made of the Fe-M-C system crystallite material (in which Fe represents iron, M represents a metal belonging to group: IVb, Vb or VIb and C represents carbon). The metal M is selected, for example, from Zr (zirconium: group IVb), Hf (hafnium: group IVb), Ta (tantalum: group Vb), V (vanadium: group Vb), Cr (chromium: group VIb) and W (tungsten: group VIb), etc.

The Fe-M-C system crystallite material has a saturation magnetic flux density of 1.5 to 1.7 T (Tesla) and specific permeability of about 4,000. Accordingly, the inductance value of the inductor comprising the coil layer and the layer of the crystallite material covering the coil layer can be increased than usual and an inductance up to about 10 uH can be attained easily.

Accordingly, in the L-C device containing the inductor, the circuit operation frequency is lowered and it can be used, for example, for the elimination of noises at a low frequency range. Further, a high inductance value can be obtained without increasing the area of the magnetic film, so that a small-sized thin film device can be obtained.

DESCRIPTION OF THE ACCOMPANYING DRAWINGS

FIG. 19 is a perspective view illustrating a state in which a first interlayer insulation film is formed on the coils;

FIG. 20 is a perspective view illustrating state in which a magnetic film is formed on the first interlayer insulation film;

DETAILED DESCRIPTION OF PREFERRED EMBODIMENT

Figure 1:
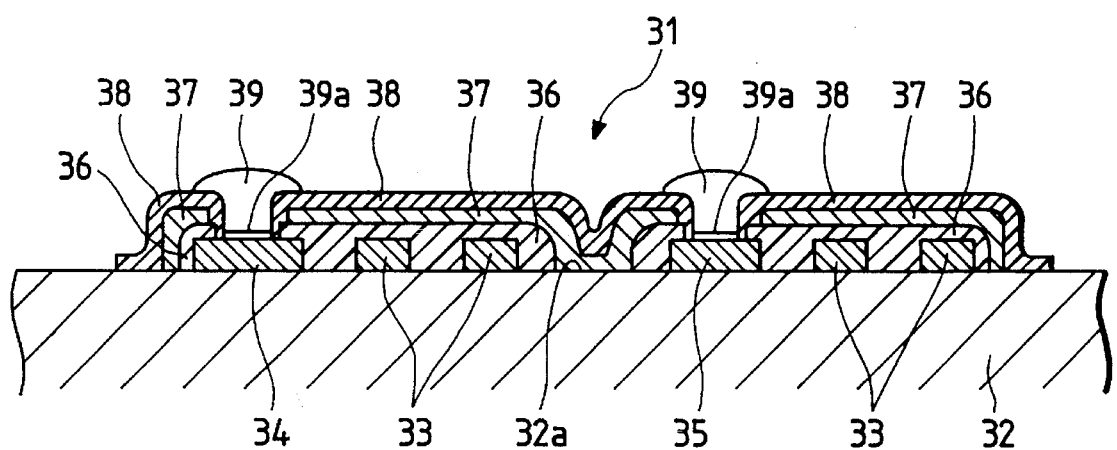
FIG. 1 is a cross sectional view illustrating a thin film device forming an inductor of a preferred embodiment according to a first aspect of the present invention.
Figure 2:
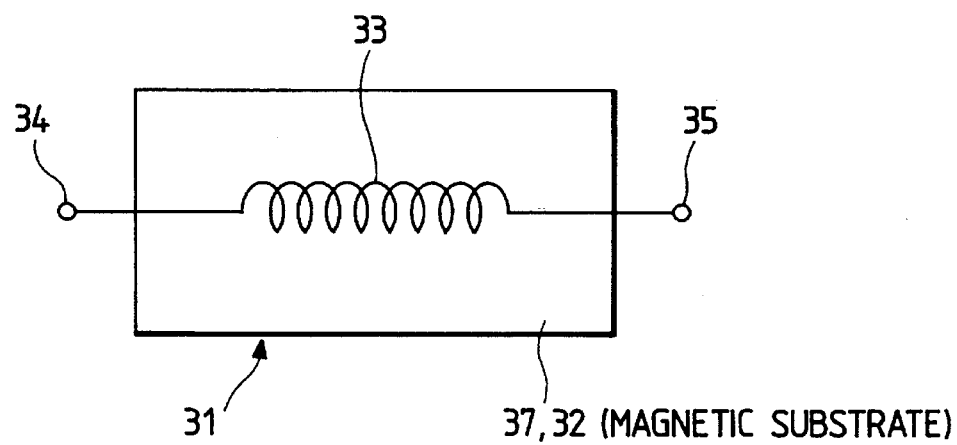
FIG. 2 is an equivalent circuit diagram for the thin film device shown in FIG. 1.

FIG. 1 is a cross sectional view of a thin film device as a preferred embodiment in the first aspect of the present invention and FIG. 2 is an equivalent circuit diagram thereof, and FIG. 3 to FIG. 7 are perspective views illustrating manufacturing steps for the thin film device successively.

A thin film device shown in this embodiment is a thin film inductor.

A thin film device 31 shown in FIG. 1 comprises a substrate 32 made of a magnetic material and having insulation property at least on the surface and, laminated therein, a coils 33 formed spirally in a planiform on the substrate 32, a first interlayer insulation film 36 formed to a portion except for terminal portions 34, 35 for the coils 33 and a magnetic material connection portion 32a of the substrate 32, a magnetic film 37 formed on the first interlayer insulation film 36 excepting for the terminal portions 34, 35 and a second interlayer insulation film 38 formed on the magnetic film 37 excepting for the terminal portions 34, 35.

The magnetic film 37 is made of an Fe-M-C system crystallite material. In this embodiment, metal M is Ta and the crystallite material has a composition of $Fe_{78}Ta_{10}C_{12}$. As shown in FIG. 1. The magnetic film 37 is formed so as to cover the coils 33 by way of the interlayer insulation film 36. Further, the magnetic film 37 and the substrate 32 are connected in the magnetic material connection portion 32a.

Further, underlying electrode films 38a, 39a are formed on the terminal portions 34, 35 of the coils 33, and bump electrodes 39, 39 are conductively connected by way of the underlying electrode films 39a, 39a to the terminal portions 34, 35. The bump electrodes 39, 39 are exposed to the surface of the uppermost interlayer insulation film 38. When the thin film device 31 is mounted to a circuit substrate, the upper side in FIG. 1 is directed to the circuit substrate, and the bump electrodes 39, 39 are attached on a conduction pattern of the circuit substrate by means of reflow soldering. Use of the bump electrodes 39, 39 makes the wire connection unnecessary between the thin film device 31 and the circuit substrate thereby enabling to minimize the mounting area.

The thin film device 31 has a circuit structure as shown in FIG. 2, which is used as an inductor device. Further, by using the thin film device 31 and a capacitor, an L-C filter can also be constituted. As the magnetic film 37 is made of the crystallite material having the composition: $Fe_{78}Ta_{10}C_{12}$, the inductance value of the equivalent circuit shown in FIG. 2 can be increased than usual.

Description will then be made to one example for a method of manufacturing the thin film device 31 of the foregoing constitution with reference to FIG. 3 to FIG. 8.

(Substrate)

Figure 3:
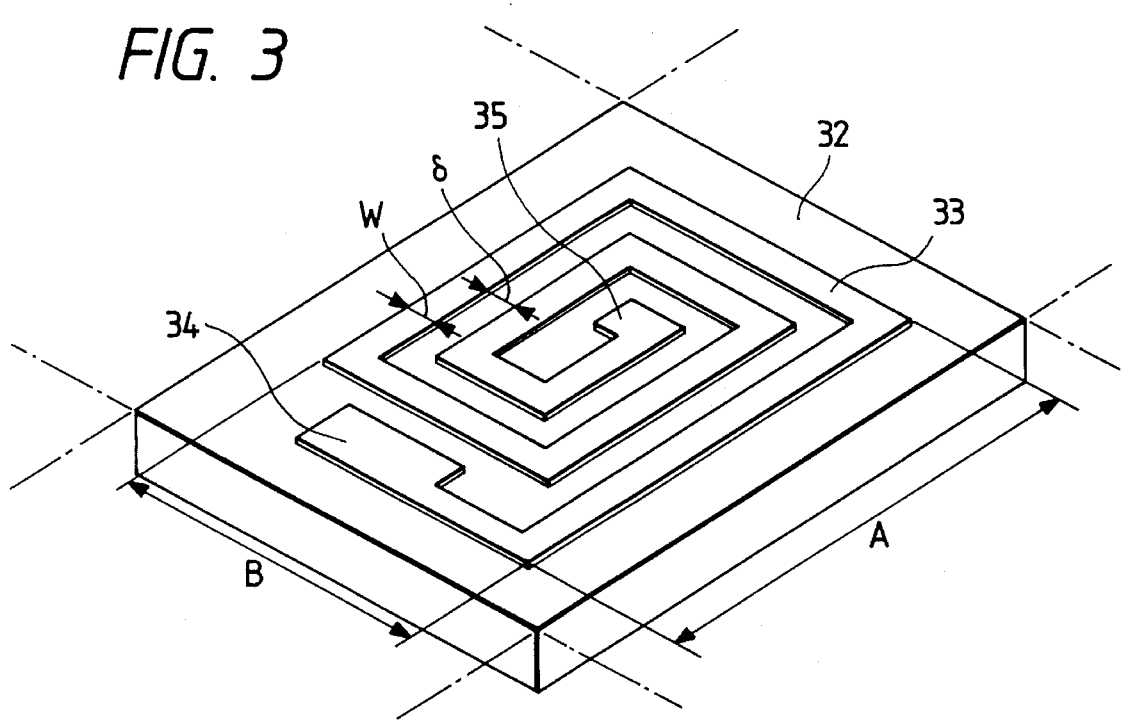
FIG. 3 is a perspective view illustrating steps for manufacturing the thin film device of the above-mentioned embodiment in which coils are formed to the substrate.

As shown in FIG. 3, the substrate 32 is a portion of a larger substrate, on which a plurality of thin film devices 31 by the order of the several tens units are formed simultaneously. Then, the substrate 32 is divided to separate individual thin film devices 31. In FIG. 3 and the subsequent figures, explanation is to be made assuming that a thin film device 31 is manufactured by forming films on one substrate 32.

The large substrate is a magnetic material, for example, of 4 inch square made of an insulating Ni-Zn ferrite substrate, having a volume resistivity $\rho$ of $10^4$ $\Omega$.cm, a saturation magnetic flux density Bs of 3,000 gauss and a coercive force Hc of 0.5 oersted (Oe). The surface of the ferrite substrate is mirror-polished till a mean center line roughness Ra reaches 100 angstrom and the substrate is cleaned by using an organic solvent (acetone or isopropanol).

Formation of Coil

The substrate after cleaning is set to a sputtering device, and a Cr film of 500 angstrom thickness are and a Cu film of thickness of 2000 angstrom formed continuously as the coil material.

Then, a photoresist film of 11 um thickness is formed on the Cr/Cu metal film by using a rotary coating device. AZ4620 (trade name) manufactured b Hoechst Co. is used as the photoresist.

After pre-baking the substrate in a clean oven at 90° C. for 30 min, contact exposure is applied by using a photomask. The photomask has a 5 inch square size, and the photomask has, formed therein, 6,000 coil patterns that can be disposed within the large substrate of 4 inch square and alignment marks for positioning with other photomasks used subsequently, which permit light to transmit at the portion for the coil pattern and the alignment but inhibit light to transmit through other portions. Further, PLA501 (trade name) of Canon Hanbai Co. is used for the contact exposure.

When the substrate after the contact exposure is developed with a liquid developer, the resist is removed from the exposed coil-shaped portion and the alignment mark portion while the resist remains in other portions than above. The substrate is post-baked in a clean oven at 120° C. for 30 min.

Then, the substrate is dipped in a mixed plating solution comprising copper sulfide and sulfuric acid to cost copper by a thickness of 10 um by electrolytic plating on the surface of the Cr/Cu metal film at a portion removed with the resist. Then, the substrate is immersed into acetone, and applied with supersonic waves simultaneously, to eliminate the resist remaining on the metal film.

After removing the resist, etching is applied to remove the Cu metal film with nitric acid and the Cr metal film with hydrochloric acid. As a result, Cr/Cu metal film is left at the portions for the coil pattern and the alignment marks to complete the formation of the coils 33 shown in FIG. 3.

As shown in FIG. 3, the spiral form of the coil 33 in this embodiment has an outer profile size (A×B) of 700 um ×700 um, a conductor width (W) of 6.4 um, a space between the coils ($\delta$) of 5 um and the number of turns of 14 (in the drawing, the number of turns is partially omitted).

Formation of First Interlayer Insulation Film

Figure 4:
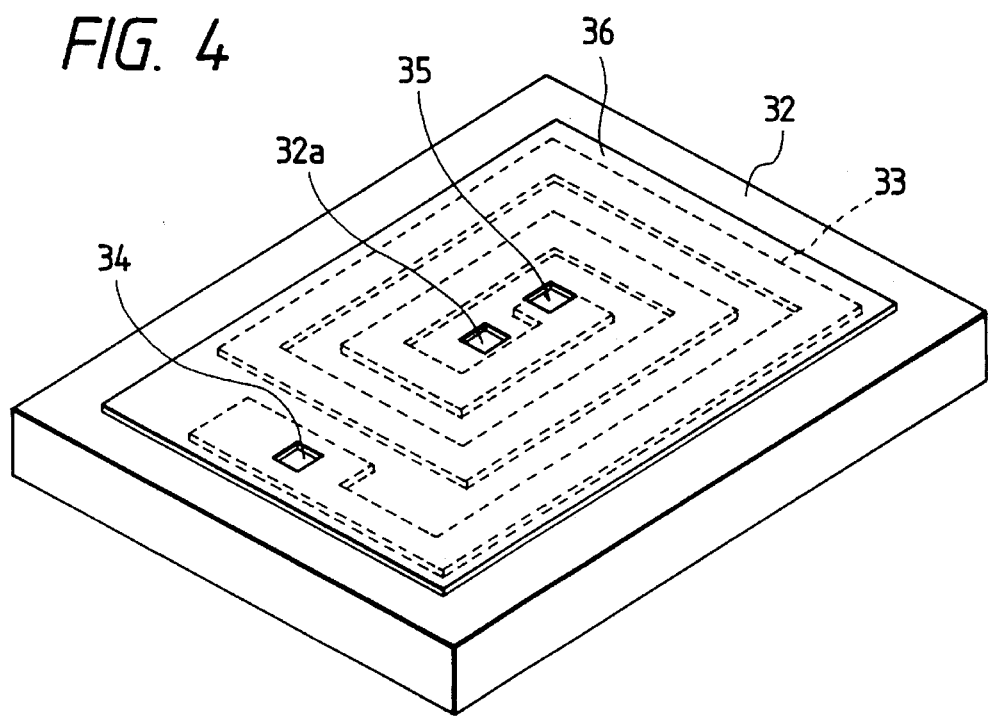
FIG. 4 is a perspective view illustrating a state in which a first interlayer insulation film is formed on the coils.

Then, after rotationally coating a photosensitive polyimide PYMEL (trade name of products manufactured by Asahi Kasei Industries Co.) to 5 um thickness on the substrate, it is applied with contact exposure by using a photomask. The pattern of the photomask has such a shape that light transmits in a region for forming the first interlayer insulation film 36 and the light does not transmit in other regions shown in FIG. 4. In the formation region for the first interlayer insulation film 36 the magnetic material connection portion 32a and the terminal portions 34, 35 for the coil 33 are blanked each in a rectangular shape. After close contact exposure, when it is pre-baked and developed, the photosensitive polyimide PYMEL other than the formation region is removed. Then, by applying post baking at 450° C., the first interlayer insulation film 36 shown in FIG. 4 is formed.

Formation of Magnetic Film

Then, the substrate is set to a sputtering device, and a crystallite material of a composition: $Fe_{78}Ta_{10}C_{12}$ is used as a target and formed to a film of 5 um thickness while cooling the substrate with water.

Subsequently, the photoresist is rotationally coated and pre-baked in the same manner as above and developed by contact exposure using a photomask having such a pattern as inhibiting light to transmit in a forming region for the magnetic film 37 and permitting light to transmit in other regions. This removes the resists in the portion other than the region for forming the magnetic film 37. Then, post baking is applied.

Figure 5:
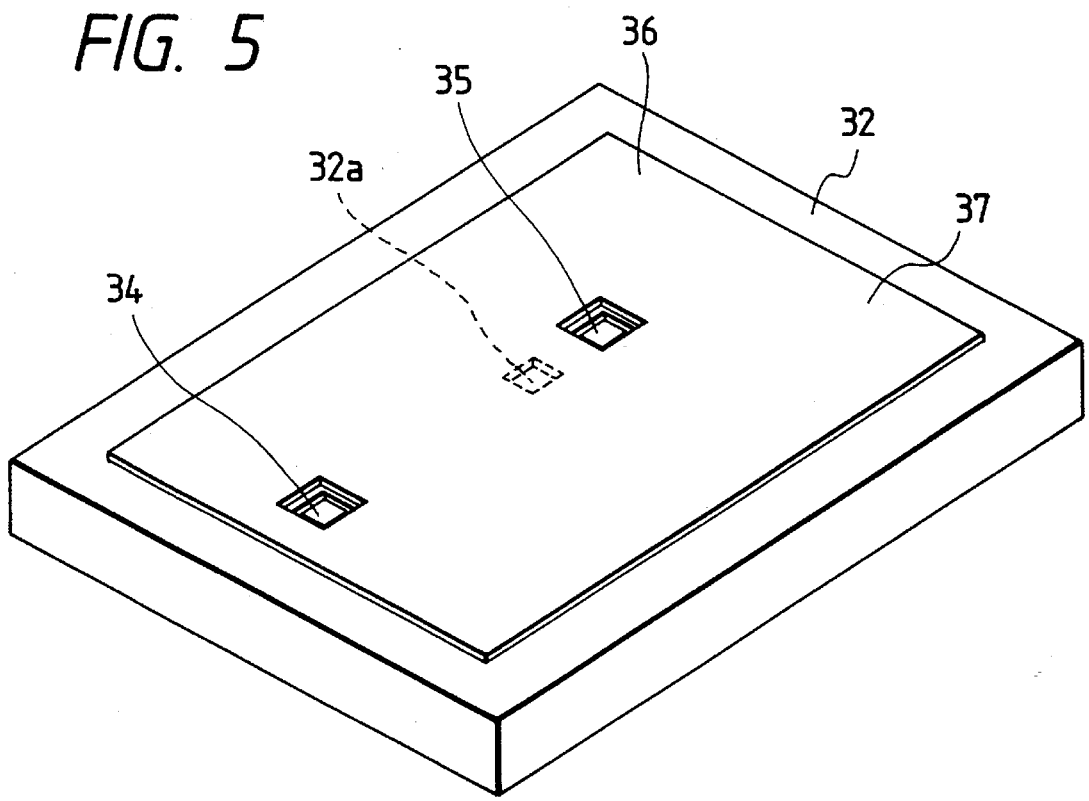
FIG. 5 is a perspective view illustrating state in which a magnetic film is formed on the first interlayer insulation film.

The substrate is set to an ion etching device and a region in which the $Fe_{78}Ta_{10}C_{12}$ film is exposed, that is, the region other than the formation region is etched. Subsequently, when the resist is removed, the magnetic film 37 of a shape shown in FIG. 5 is formed. The magnetic film 37 is connected with the substrate 32 in the magnetic material connection portion 32a (refer to FIG. 1).

Subsequently, the substrate is annealed at 450° C. for 60 min being rotated in a magnetic field of 300 oersted (Oe) in vacuum. Thus, a magnetic film 37 having excellent magnetic characteristics with a magnetic flux density Bs of 17,000 gauss and a coercive force Hc of 0.1 oersted (Oe) is obtained.

Formation of Second Interlayer Insulation Film

Figure 6:
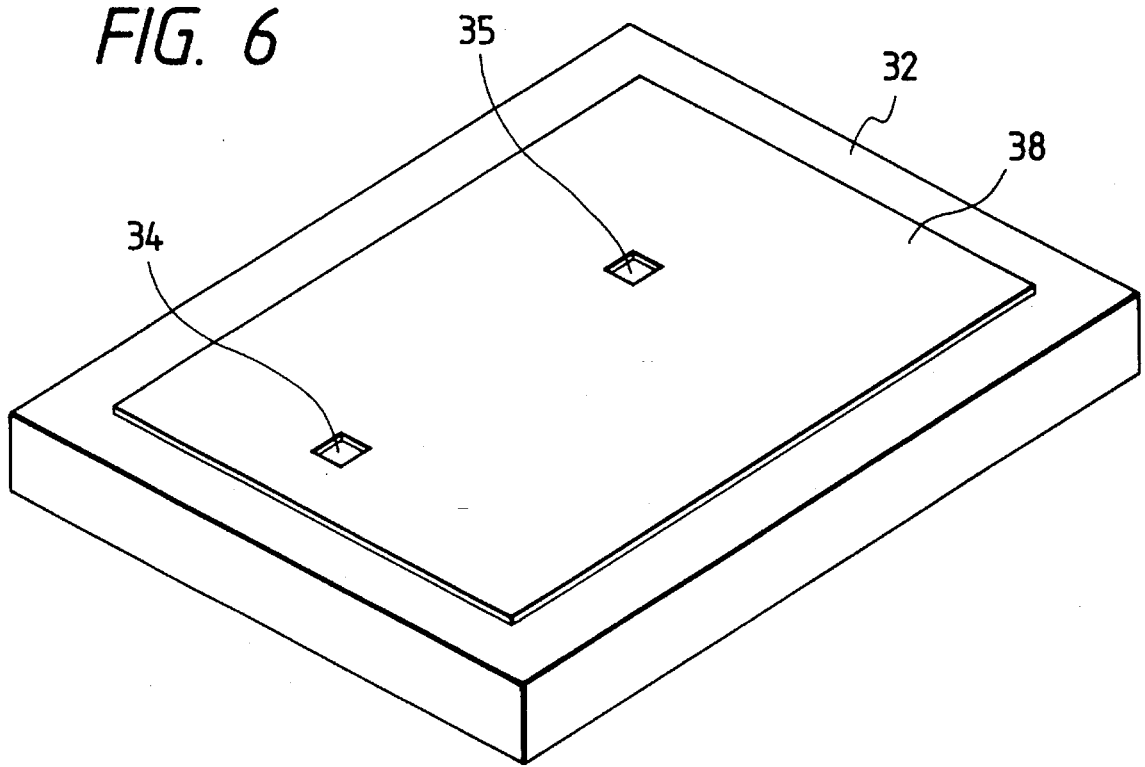
FIG. 6 is a perspective view illustrating a state in which a second interlayer insulation film is formed.

The forming step is identical with the method of forming the first interlayer insulation film 36. After rotationally coating a photosensitive polyimide PYMEL on a substrate, it is applied with contact exposure by using a photomask, pre-baked developed and then post baked at 450° C. to form a second interlayer insulation film 38 as shown in FIG. 6. The second interlayer insulation film 38 is formed so as to cover the magnetic layer 37 excepting for the terminal portions 34, 35 of the coils 33.

Formation of Bump Electrode

The substrate on which the second interlayer insulation film 38 has been formed is set to a sputtering device, and a Cr film of 500 angstrom thickness and a Cu film of 2,000 angstrom thickness are formed continuously as underlying electrodes 39a for the solder plating of bump electrodes.

Then, a photoresist film of 11 um thickness is formed on the Cr/Cu metal film by using a rotary coating device. As a photoresist, AZ4620 (trade name) manufactured by Hoechst Co. is used.

After pre-baking in a clean oven at 90° C. for 30 min, it is applied with contact exposure by using a photomask. The photomask permits light to transmit through a portion for the bump electrodes inhibits light to transmit through other portions. When the substrate after contact exposure is developed with a liquid developer, the resist is removed from the exposed portion of the bump electrodes and the resist remains in other portions. The substrate is post-baked in a clean oven at 120° C. for 30 min.

Then, the substrate is dipped in a nickel plating bath using sodium hypophosphite as a reducing agent and nickel is coated by electroless plating to a thickness of 1 um on the surface of the Cr/Cu metal film to a portion from which the resist has been removed. Subsequently, the substrate is dipped in a solder plating bath containing hydroborofluoric acid and solder is coated by electroless plating to a thickness of 40 um on the nickel layer.

Then, the substrate is dipped into acetone and supersonic waves are applied simultaneously to remove the resist remaining on the metal film.

After removing the resist, the Cu metal film is removed by nitric acid while the Cr metal film is removed by hydrochloric acid through etching. As a result, the bump electrodes 39, 39 are formed (refer to FIG. 7).

Figure 27:
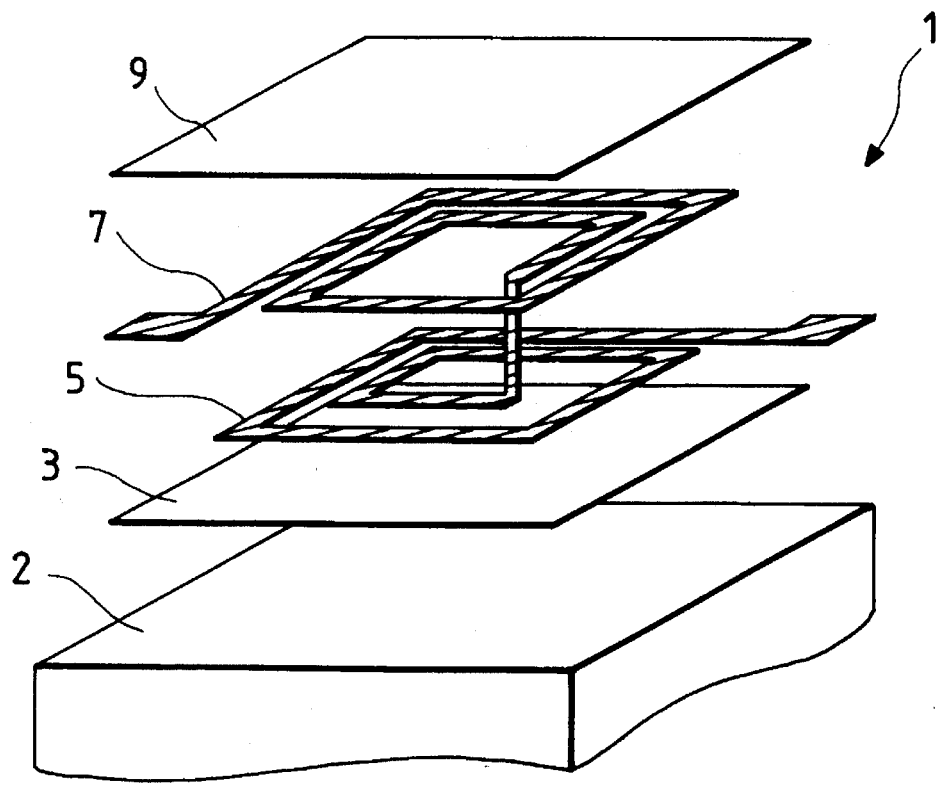
FIG. 27 is a perspective view of a dual layer spiral coil type thin film inductor in the prior art.
Figure 28:
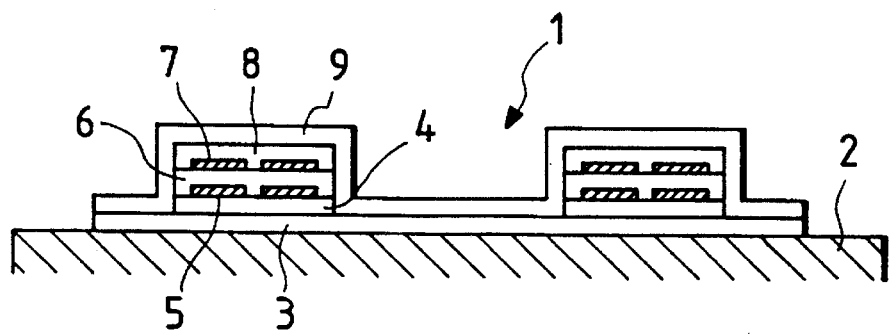
FIG. 28 is a cross sectional view of a dual layer spiral coil type thin film inductor in the prior art.
Figure 29A:
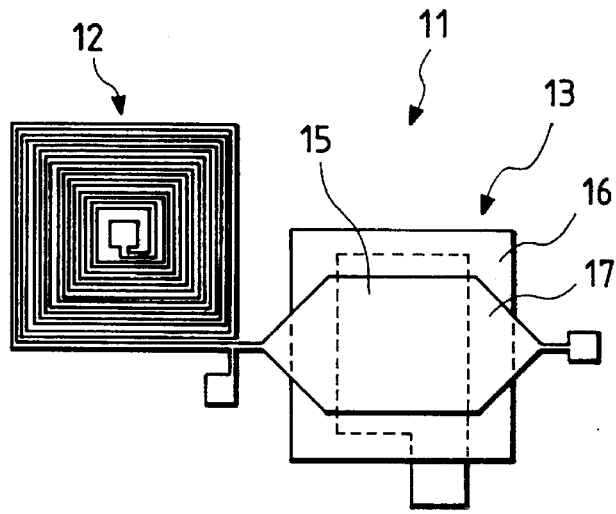
FIG. 29(A) is an upper plan view of a magnetic thin film L-C filter in the prior art.
Figure 29B:
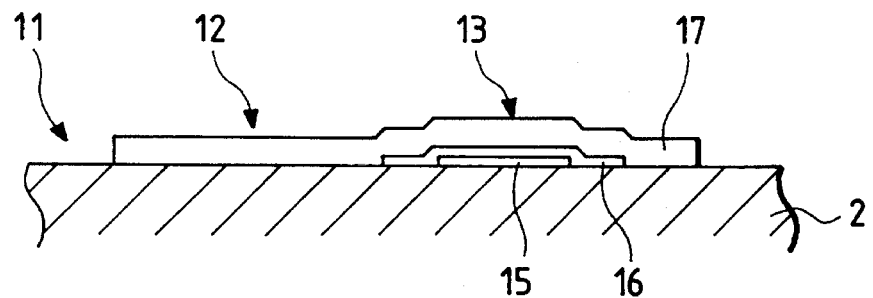
FIG. 29(B) is a front elevational cross sectional view thereof and FIG. 29(C) is a cross sectional view of coil layers.
Figure 29C:
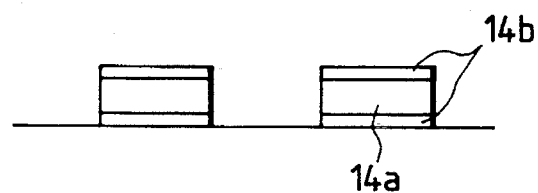

The inductance value of the thin film chip inductor having the foregoing constitution is 9.8 uH, which is about 70 times as great as the inductance value at an inductor portion in the prior art shown in FIG. 27 and FIG. 28.

In the above-mentioned embodiment a material which is magnetic and entirely insulative is used as the substrate 32. However, a magnetic material with no insulation property and having an insulation film formed on the surface can also be used as the substrate.

Alternatively, a substrate 32 made of a non-magnetic material may be used, and a magnetic film of a crystallite material having a composition: $Fe_{78}Ta_{10}C_{12}$ is formed on the surface and coils are formed on the magnetic film by way of an insulation film. Such a structure is shown in FIG. 8.

Figure 8:
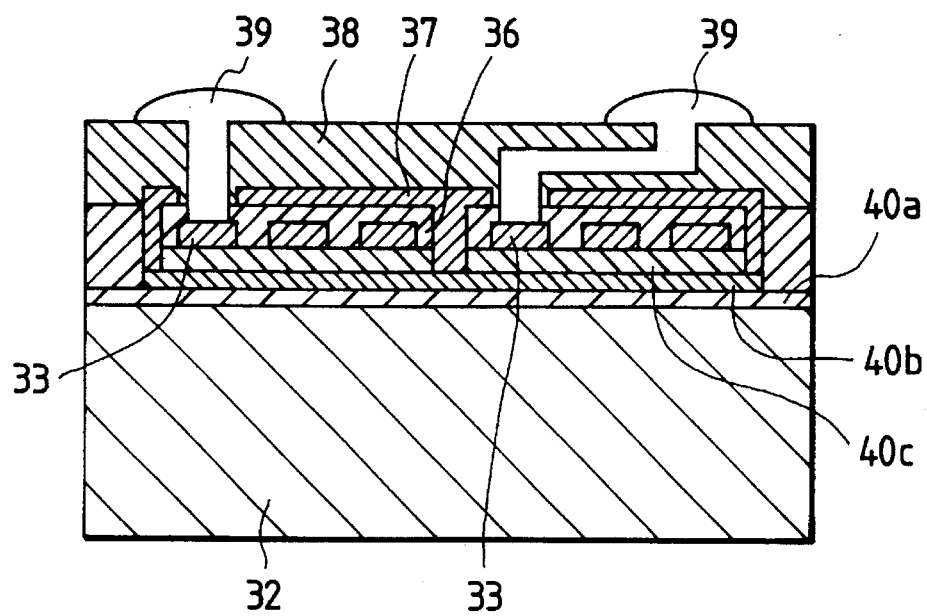
FIG. 8 is a cross sectional view illustrating a modified embodiment of a thin film device according to the first aspect of the present invention.

In the embodiment of FIG. 8, a bottom insulation film 40a is formed on a silicon substrate 32, on which a bottom magnetic film 40b is formed. The bottom magnetic film 40b is formed by sputtering using a crystallite material having a composition: $Fe_{78}Ta_{10}C_{12}$ in the same manner as the magnetic film 37. Further, an insulation film 40c is formed on the surface of the bottom magnetic film 40b. In the same manner as the step described above, coils 33, a first interlayer insulation film 36, a magnetic film 37, a second interlayer insulation film 38 and bump electrodes 39 are formed on the film 40c.

The bottom magnetic film 40b and the magnetic film 37 are made of the same crystallite material having a composition: $Fe_{78}Ta_{10}C_{12}$ and connected with each other. Since upper and lower surfaces of the coils 33 are covered with the crystallite material having the composition: $Fe_{78}Ta_{10}C_{12}$, the inductance value can be increased more.

Figure 9:
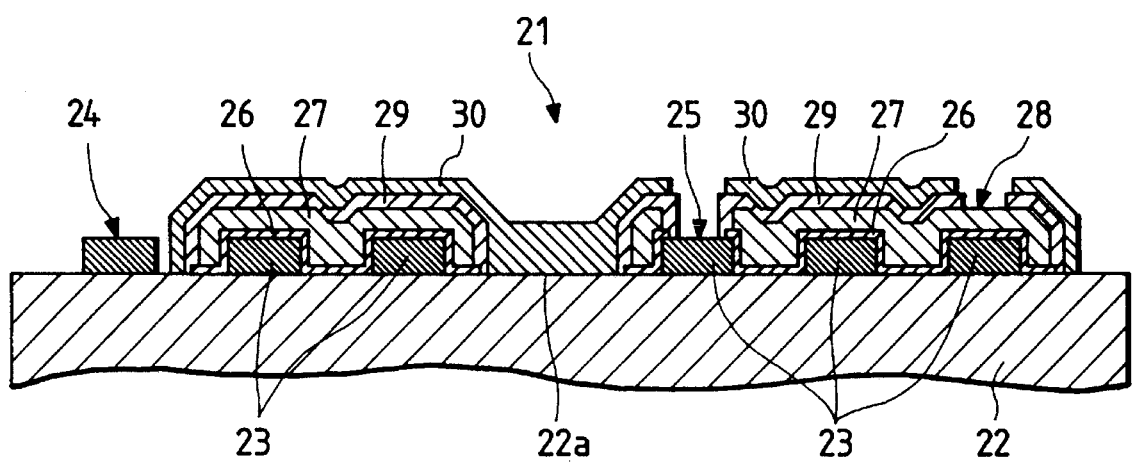
FIG. 9 is a cross sectional view illustrating a preferred embodiment of a thin film device according to a second aspect of the present invention.
Figure 10:
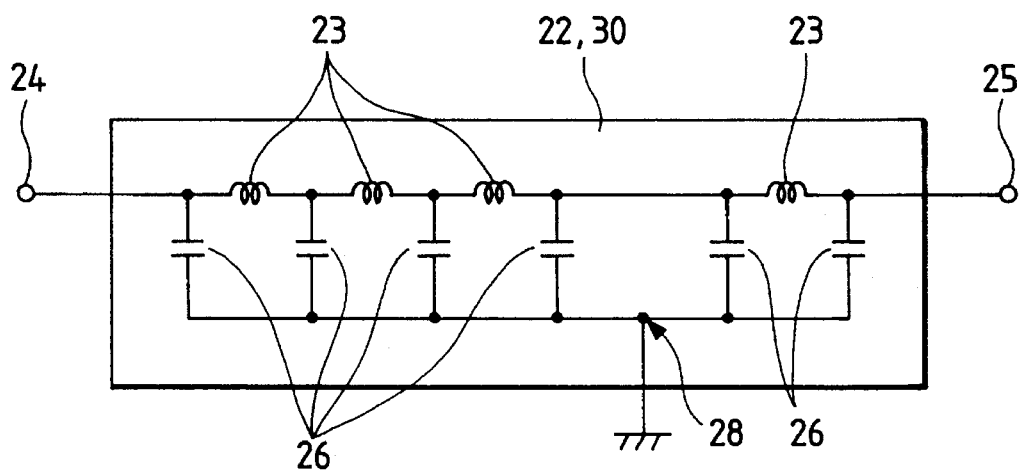
FIG. 10 is an equivalent circuit diagram for the thin film device shown in FIG. 9.

FIG. 9 is a cross sectional view illustrating a structure of a thin film device 21 as an embodiment of the second aspect of the present invention, FIG. 10 is a circuit diagram illustrating an equivalent circuit thereof and FIG. 11 through FIG. 15 are perspective views showing a portion of manufacturing steps therefor.

A thin film device 21 shown in FIG. 9 has an L-C constitution which is used, for example, as a chip type filter.

The thin film device 21 comprises a substrate 22 composed of a material which is magnetic and has insulation property at least on the surface, coils 23 formed spirally as a planiform on the substrate 22, a dielectric film 26 formed to a portion excepting for terminal portions 24, 25 of the coils 23 and a magnetic material connection portion 22a of the substrate 22, a conductor film 27 formed on the dielectric film 26 excepting for the magnetic material connection portion 22a and the terminal portion 25, an interlayer insulation film 29 formed on the conductor film 27 excepting for a terminal portion 28 formed to the conductor film 27, and a magnetic film 30 disposed to a portion excepting for the terminal portion 25 and the terminal portion 28. The magnetic film 30 is connected at the magnetic material connection portion 22a with the substrate 22.

Although not illustrated in FIG. 9, an interlayer insulation film identical with that shown by reference numeral 38 in FIG. 1 is formed to the surface of the magnetic film 30 and a surface portion excepting for the terminal portion 24 of the coils 23 and, further, bump electrodes in conduction with the terminal portions 24, 25 and 28 are formed, and the bump electrodes are exposed on the uppermost interlayer insulation film.

As shown in FIG. 10, a thin film device 21 constitutes a distributed constant type L-C device. In a case of using the device as the L-C filter, the terminal portion 24 is connected to an input side in the digital circuit, the terminal portion 25 is connected in an output circuit and the terminal portion 28 is grounded to the earth in a digital circuit for and used for eliminating noises in the input signals.

Then, description will be made to a method of manufacturing the thin film chip L-C filter having the foregoing constitution with reference to FIG. 11 through FIG. 15.

Substrate

Figure 11:
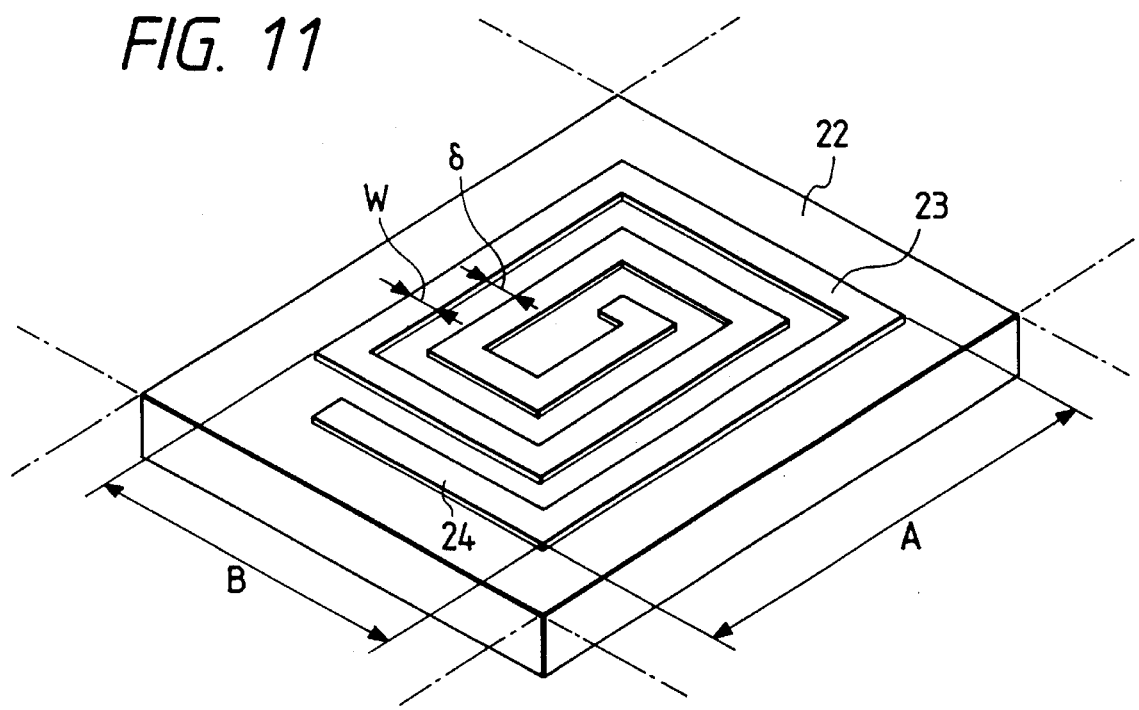
FIG. 11 is a perspective view illustrating steps for manufacturing the thin film device of the above-mentioned embodiment in which coils are formed to the substrate.

A substrate 22 shown in FIG. 11 is identical with that shown in FIG. 3, which constitutes a portion of a large substrate made of magnetic and insulative Ni-Zn ferrite. It has a volume resistivity ρ of $10^4$ Ω.cm, a saturation magnetic flux density Bs of 3,000 gauss, and the coercive force Hc of 0.5 oersted (Oe). The mean center line roughness Ra of the ferrite substrate is 100 angstrom, and the substrate is cleaned by using an organic solvent (acetone, isopropanol).

Formation of Coils

A steps for forming coils is identical with that shown in FIG. 3. That is, a Cr film of 500 angstrom and a Cu film of 2,000 angstrom are formed continuously and then a photoresist film is formed. After baking in a clean oven, it was applied with contact exposure by using a photomask. When the substrate after contact exposure is developed with a liquid developer, the resist is removed from an exposed coil-shaped portion, while the resist remain in other portions. The substrate is post-baked. The substrate is dipped into a mixed plating solution of copper sulfide and sulfuric acid to deposit copper on the surface of the Cr/Cu metal film at a portion removed with the resist by electrolytic-plating. Then, the substrate is dipped into acetone and applied with supersonic waves simultaneously to remove the resist remaining on the metal film. After removing the resist, etching is applied with nitric acid and hydrochloric acid to form coils 23.

The coils 23 shown in FIG. 11 are in an identical shape with that shown in FIG. 3, having an outer profile size (A×B) of 700 um×700 um, a conductor width (W) of 6.4 um, an inter-coil space (δ) of 5 um and a number of turns of 14.

Formation of Dielectric Film

Figure 12:
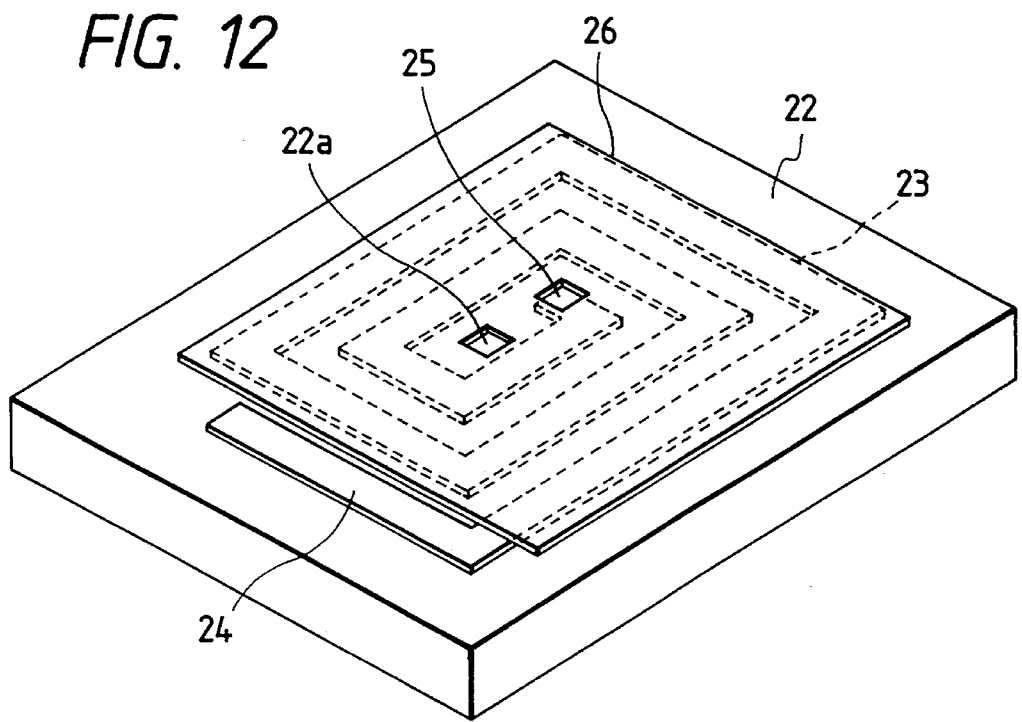
FIG. 12 is a perspective view illustrating a state in which a dielectric film is formed on the coils.

In the same procedures as described above, a photoresist is coated rotationally on the surface of the substrate 22 and the surface of the coils 23 and, after prebaking, applied with contact exposure by using a photomask. The contact exposure is applied for covering the portion other than the sputtering region of the dielectric film 26 as shown in FIG. 12. That is, the pattern of the photomask has such a shape as inhibiting light to transmit in rectangular regions for forming a terminal portion 25 of the coils 23 and a magnetic material connection portion 22a of the substrate 22 and in the outer peripheral region including the terminal portion 24 and permitting light to transmit is other coil covering regions. Then, when the resist is developed to remove the resist from a portion is which light transmits, the resist is removed at a region to be formed with the dielectric film 26 and the resist remains in other regions on the substrate.

The substrate is set to a sputtering device and a $Ta_2O_5$ film is formed to a thickness of 700 angstrom as the material for the dielectric film. Subsequently, the substrate is dipped into acetone and applied with supersonic waves to remove the resist remaining on the substrate together with the $Ta_2O_5$ film formed thereon. Thus, as shown in FIG. 12, the terminal portion 25 and the magnetic material connection portion 22a are exposed through the opening, and a dielectric film ($Ta_2O_5$) 26 covering the coils 23 are formed to a portion excepting for the outer peripheral region including the terminal portion 24.

Formation of Conductor Film

Then, the substrate is set to a sputtering device and a Cr film of 500 angstrom thickness and a Cu film of 2,000 angstrom thickness are continuously formed.

Subsequently, after rotationally coating a photoresist and pre-baking it, contact exposure is applied by using a photomask. The photomask used in this step has such a pattern shown in FIG. 13 as permitting light to transmit in a region for forming the conductor film 27 and inhibiting light to transmit in other regions. Upon development, the resist is removed from the region for forming the conductor film 27 and the resist remains in other regions, which is then post-baked.

The substrate is dipped into a mixed plating solution comprising copper sulfide and sulfuric acid in the same way as in the coil forming step, a Cu layer is deposited to a thickness of 10 um on the surface of the Cr/Cu metal film at a portion removed with the resist and then the substrate is dipped into acetone and applied with supersonic waves to remove the remaining resist. The substrate is etched by an etching solution to remove the Cu/Cr metal film from a portion not applied with copper plating.

Figure 13:
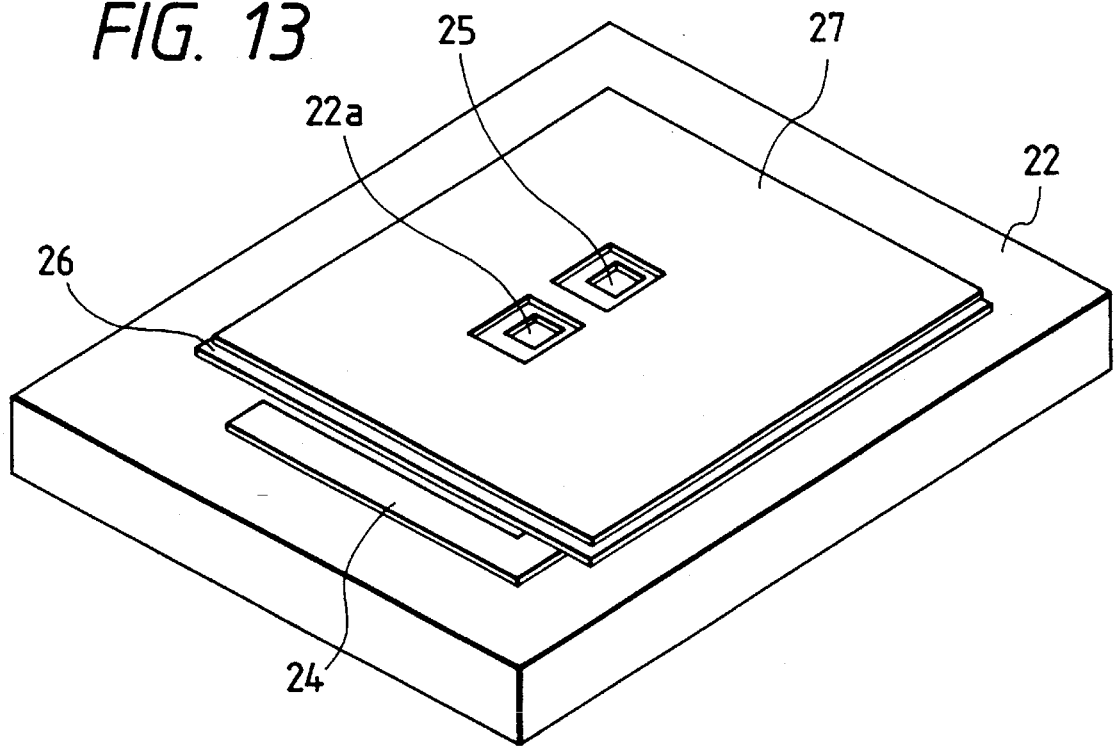
FIG. 13 is a perspective view illustrating a state in which a dielectric film is formed on the dielectric film.
Figure 14:
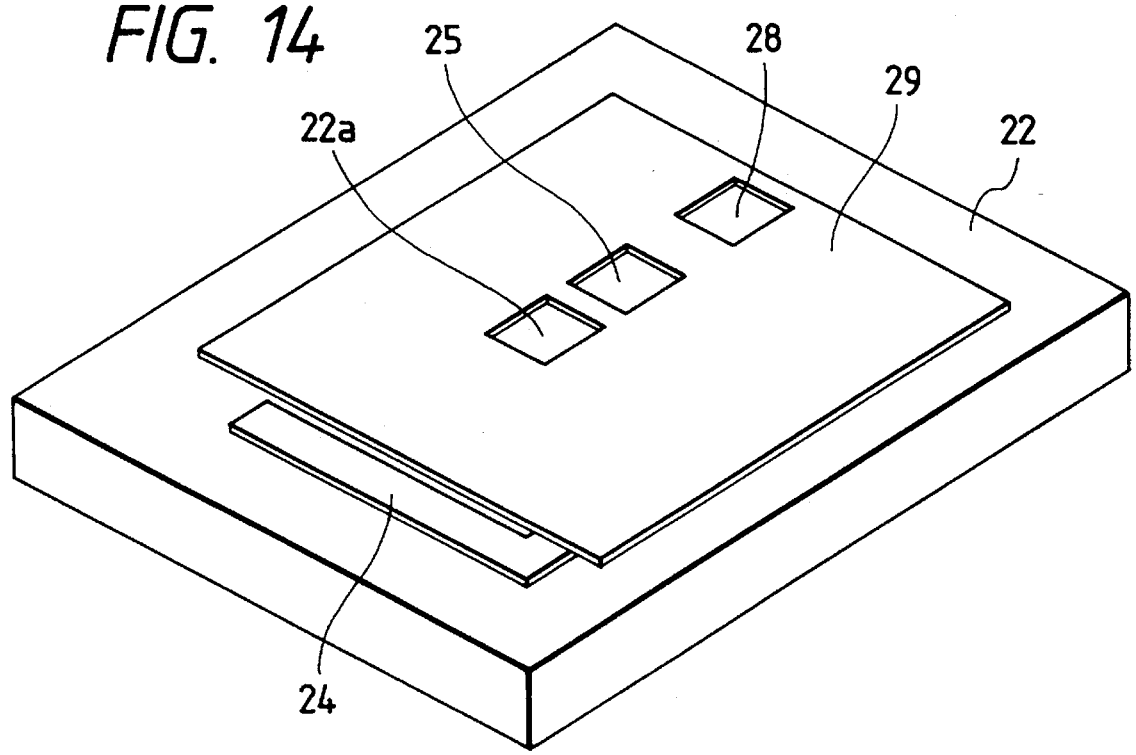
FIG. 14 is a perspective view illustrating a state in which an interlayer insulation film is formed.

Thus, as shown in FIG. 13, a conductor film 27 covering the dielectric film 26 is formed.

Formation of Interlayer Insulation Film

The step for forming an interlayer insulation film 29 is identical with the step for forming the interlayer insulation film 36 shown in FIG. 4 or the interlayer insulation film 38 shown in FIG. 6.

That is, after rotationally coating a photosensitive polyimide PYMEL to a thickness of 5 um, it is applied with contact exposure by using a photomask. After contact exposure, it is pre-baked, developed and then post-baked to form an interlayer insulation film 29 shown in FIG. 14. The interlayer insulation film 29 is formed to a portion excepting for terminal portion 24, 25 and 28 and a magnetic material connection portion 22a.

Formation of Magnetic Film

A step for forming a magnetic film 30 is identical with the step for forming the magnetic film 37 shown in FIG. 5.

The substrate is set to a sputtering device and a film is formed to a thickness of 5 um from a target having a composition: $Fe_{78}Ta_{10}C_{12}$ while ice-cooling the substrate. Then, a photoresist is rotationally coated, pre-baked, and applied with contact exposure by using a photomask having such a pattern as inhibiting light to transmit in a region for forming the magnetic film 30 and permitting light to transmit in other region shown in FIG. 10, followed by development. Thus, the resist in a portion other than the region for forming the magnetic film 30 is removed. Then post-baking is applied.

Figure 15:
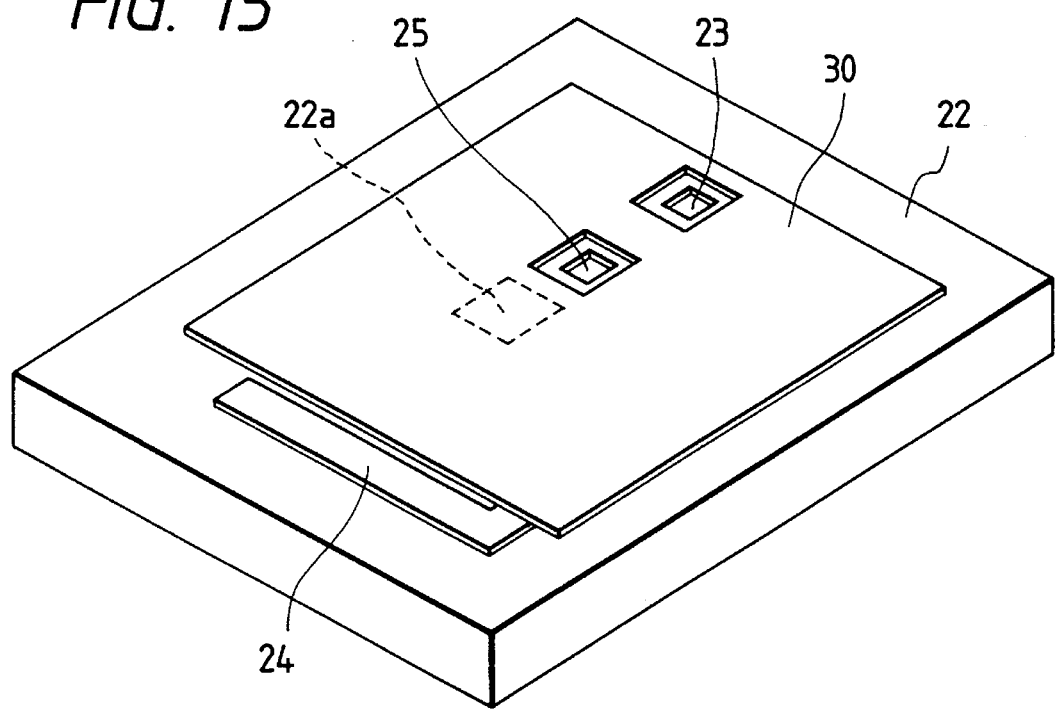
FIG. 15 is a perspective view illustrating a state in which a magnetic film is formed.

The substrate is set to an ion etching device and applied with etching at a region through which the $Fe_{78}Ta_{10}C_{12}$ film is exposed, that is, a region other than the formation region. Subsequently, when the resist is removed, a magnetic film 30 of a shape shown in FIG. 15 is formed. The magnetic film 30 is connected with the substrate 22 in the magnetic material connection portion 22a (refer to FIG. 9).

Subsequently, the substrate is annealed at 450° C. for 60 min being rotated in a magnetic field of 300 oersted (Oe) in vacuum. Thus, a magnetic film 30 having excellent magnetic characteristics of a magnetic flux density Bs of 16,000 gauss and a coercive force Hc of 0.1 oersted (Oe).

Subsequently, an insulation film is formed on the insulation film 30 to form bump electrodes to be connected with each of terminal portions 24, 25 and 28.

The thin film chip L-C filter formed by the manufacturing method described above is a distributed constant type as the equivalent circuit shown in FIG. 10 and covered with magnetic material.

The L-C filter in the above-mentioned embodiment has a cut-off frequency (a frequency causing insertion loss of 3 dB) at 1 MHz, and an insertion loss at 10 MHz frequency is 24 dB. In the prior art, the cut-off frequency is higher than 30 MHz. It can thus be seen that the L-C filter of this embodiment has excellent characteristics capable of eliminating noises in a low frequency region.

In this embodiment, a material which is magnetic and entirely insulative is used as the substrate 22, but a magnetic material with no insulation property and having an insulation film formed on the surface can also be used as the substrate. Alternatively, in the same manner as shown in FIG. 8, a magnetic film and an insulation film may be formed by way of an insulation film on the surface of a magnetic substrate 22 and coils may be formed thereon.

Figure 16:
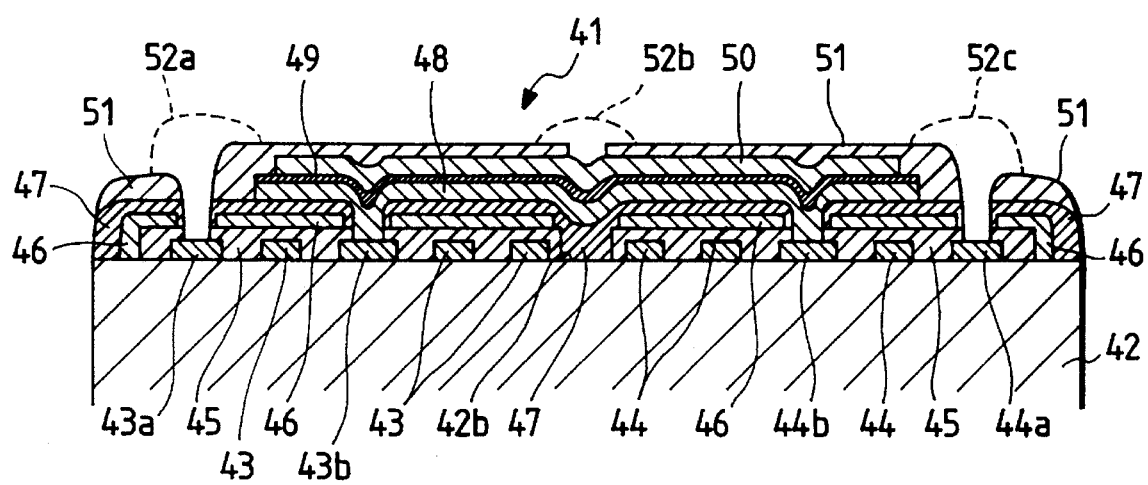
FIG. 16 is a cross sectional view illustrating a thin film device as a preferred embodiment according to a third aspect of the present invention.
Figure 17:
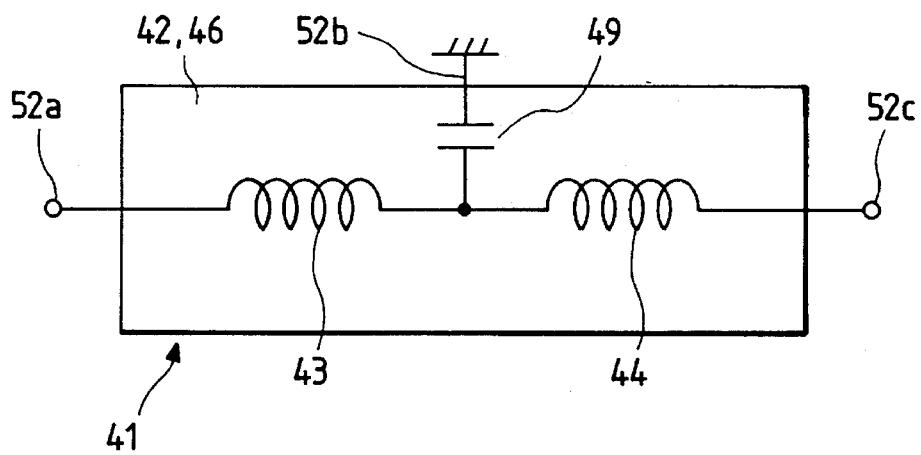
FIG. 17 is an equivalent circuit diagram for the thin film device shown in FIG. 16.

FIG. 16 is a cross sectional view illustrating a thin film device 41 as a preferred embodiment according to the third aspect of the present invention, FIG. 17 is an equivalent circuit diagram thereof and FIG. 18 through FIG. 25 are perspective views illustrating manufacturing steps for the thin film device 41 in the order of the steps. A cross sectional view shown in FIG. 16 is taken along lines XVI—XVI in FIG. 18.

The thin film device 41 shown in FIG. 16 is a lumped constant type L-C device.

The thin film device 41 comprises a substrate 42 which is magnetic and having an insulation property at least on the surface, a pair of coils 43, 44 formed spirally in a planiform on the substrate 42, first interlayer insulation film 45, 45 formed to a portion excepting for terminal portions 43a, 43b, 44a, 44b of the coils 43, 44, magnetic material connection portions 42a, 42a of the substrate 42 and gaps 42b between the coils 43 and 44, and magnetic films 46, 46 laminated on the interlayer insulation films 45, 45 at a portion excepting for terminal portions 43a, 3b, 44a, 44b of the coils 43, 44 and the gaps 42b between the coils 43 and 44. The magnetic films 46, 46 are formed with a crystallite material having a composition: $Fe_{78}Ta_{10}C_{12}$ in the same manner as in each of the previous embodiments.

A second interlayer insulation film 47 is formed on the magnetic films 46, 46 and on the gap 42b between the coils 43 and 44, on which a first conductor film 48 is formed. The first conductor film 48 is connected with the terminal portion 43b of the coils 43 and the terminal portions 44b of the coils 44, and both of the coils 43 and 44 are conductively connected by the first conductor film 48.

A second conductor film 50 is formed on the first conductor film 48 by way of a dielectric film 49, on which a third interlayer insulation film 51 is formed. Then, a bump electrode 52a is connected with the terminal portion 43a of the coils 43, while the bump electrode 52b is connected with the second conductor film 50, and the bump electrode 52c is connected with the terminal portion 44a of the coils 44.

As shown in FIG. 17, the thin film device 41 having the above-mentioned constitution constitutes a lumped constant type L-C device. When it is used, for example, as an L-C filter, the bump electrode 52a is connected with an input, the bump electrode 52c is connected to an output, and the bump electrode 52b is grounded to the earth in a digital circuit.

Description will be made to a method of manufacturing the thin film device 41.

Substrate

Figure 18:
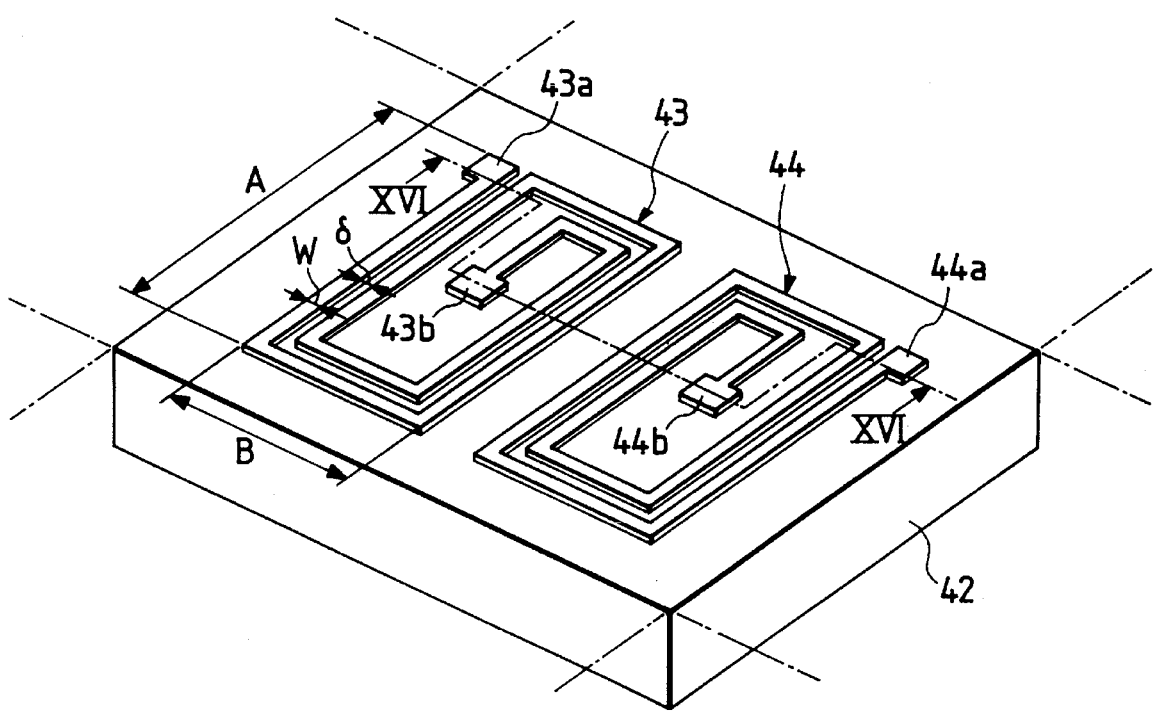
FIG. 18 is a perspective view illustrating steps for manufacturing the thin film device of the above-mentioned embodiment in which coils are formed to the substrate.

FIG. 18 shows a substrate 42. The substrate 42 is identical with that in each of the previous embodiments, which is a magnetic and insulative Ni-Zn ferrite substrate having a volume resistivity $\rho$ of $10^4$ $\Omega$.cm, a saturation magnetic flux density Bs of 3,000 gauss and a coercive force Hc of 0.5 oersted (Oe). The ferrite substrate is mirror-polished till the mean surface roughness Ra reaches 100 angstrom, and the substrate is cleaned with an organic solvent (acetone, isopropanol) for use.

Formation of Coils

The coils 43, 44 shown in FIG. 18 are formed by the same step as for the coils 33 shown in FIG. 3 and the coils 23 shown in FIG. 11, in which a Cr film of 500 angstrom thickness and a Cu film of 2,000 angstrom are formed continuously as the coil material by a sputtering device. Then, a photoresist film of 11 um thickness is formed on the Cr/Cu metal film. After pre-baking the same, it is applied with contact exposure by using a photomask.

The substrate after contact exposure is developed with a liquid developer to remove the resist from a coil-shaped portion and then post-baked. Then, the substrate is dipped into a mixed plating solution comprising copper sulfide and sulfuric acid, depositing a copper layer of 10 um thickness by electrolytic plating on the surface of the Cr/Cu metal film at a portion from which the resist has been removed, the substrate is dipped into acetone and applied with supersonic waves simultaneously to remove the resist remaining on the metal film. After removing the resist, the Cu metal films is removed by nitric acid and the Cr metal film is removed by hydrochloric acid through etching. As a result, a pair of coils 43, 44 shown in FIG. 18 are formed.

As shown in FIG. 18, each of the coils 43, 44 of this embodiment has an outer profile size (A×B) of 700 um×700 um having a conductor width (W) of 6.4 um, an inter-coil space ($\delta$) of 5 um and a number of turns of 14.

Formation of First Interlayer Insulation Film

The first interlayer insulation films 45, 45 shown in FIG. 19 are formed by the same method as that in each of the previous embodiment, and the a region for forming the first interlayer insulation films 45, 45 is generally a rectangular shape from which portions for magnetic material connection portions 42a, 42a and terminal portions 43a, 43b, 44a, 44b are blanked.

Formation of Magnetic Film

Magnetic films 46, 46 shown in FIG. 20 are formed by the same method as that for the magnetic film 37 shown in FIG. 5 or the magnetic film shown in FIG. 15 and they are formed to a film of 5 um thickness from a target having a composition: $Fe_{78}Ta_{10}C_{12}$ while ice cleaning the substrate.

Subsequently, the photoresist is rotationally coated, pre-baked, applied with contact exposure and developed and then the photoresist is removed and post-baking is applied.

The substrate is annealed at 450° C. for 60 min being rotated in a magnetic field of 300 oersted (Oe) in vacuum. Thus, magnetic films 46, 46 having excellent magnetic characteristics of a magnetic flux density Bs of 17,000 gauss and a coercive force Hc of 0.1 oersted (Oe) are obtained.

Formation of Second Layer Insulation Film

Figure 21:
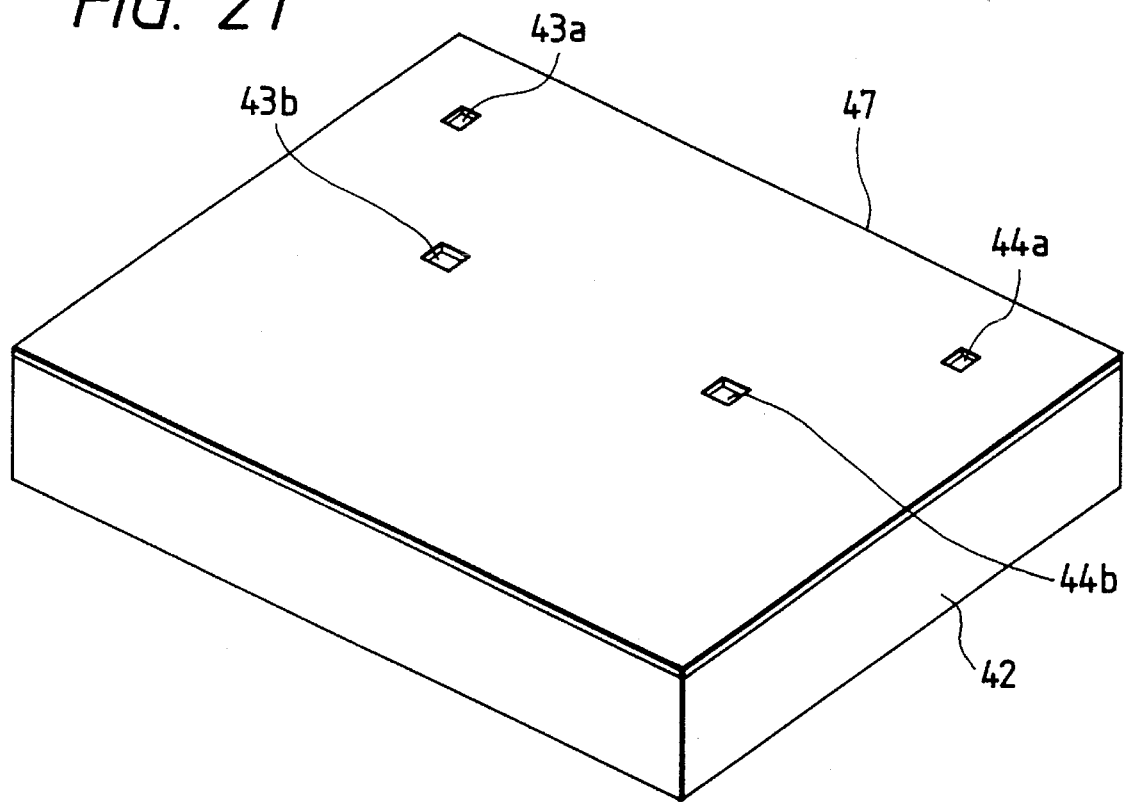
FIG. 21 is a perspective view illustrating state in which a second interlayer insulation film is formed on the magnetic film.

Then, in the same steps as that for the previous interlayer insulation films, a second interlayer insulation film 47 shown in FIG. 21 is formed. The region for forming the second interlayer insulation film 47 has a shape from which each of rectangular portions 43a, 43b, 44a and 44b is blanked.

Formation of First Conductor film and Dielectric Film

Then, the substrate is set to a sputtering device and a Cr film of 500 angstrom thickness and a Cu film of 2,000 angstrom thickness are formed continuously. Subsequently, a photoresist is coated rotationally and pre-baked and then it is applied with contact exposure by using a photomask and developed to remove the resist in the region for forming the first conductor film 48 which is then post-baked. The substrate is dipped into a mixed plating solution comprising copper sulfide and sulfuric acid in the same manner as the coil forming step, and a Cu layer is plated to a thickness of 10 um on the surface of the Cr/Cu metal film to a portion removed with the resist.

The substrate is set to a sputtering device and a $Ta_2O_5$ film is formed as the material for the dielectric film to a thickness of 700 angstrom to the plated portion and the resist portion. Then, the substrate is dipped into acetone and applied with supersonic waves to remove the resist remaining on the substrate and the $Ta_2O_5$ film formed thereon together.

Figure 22:
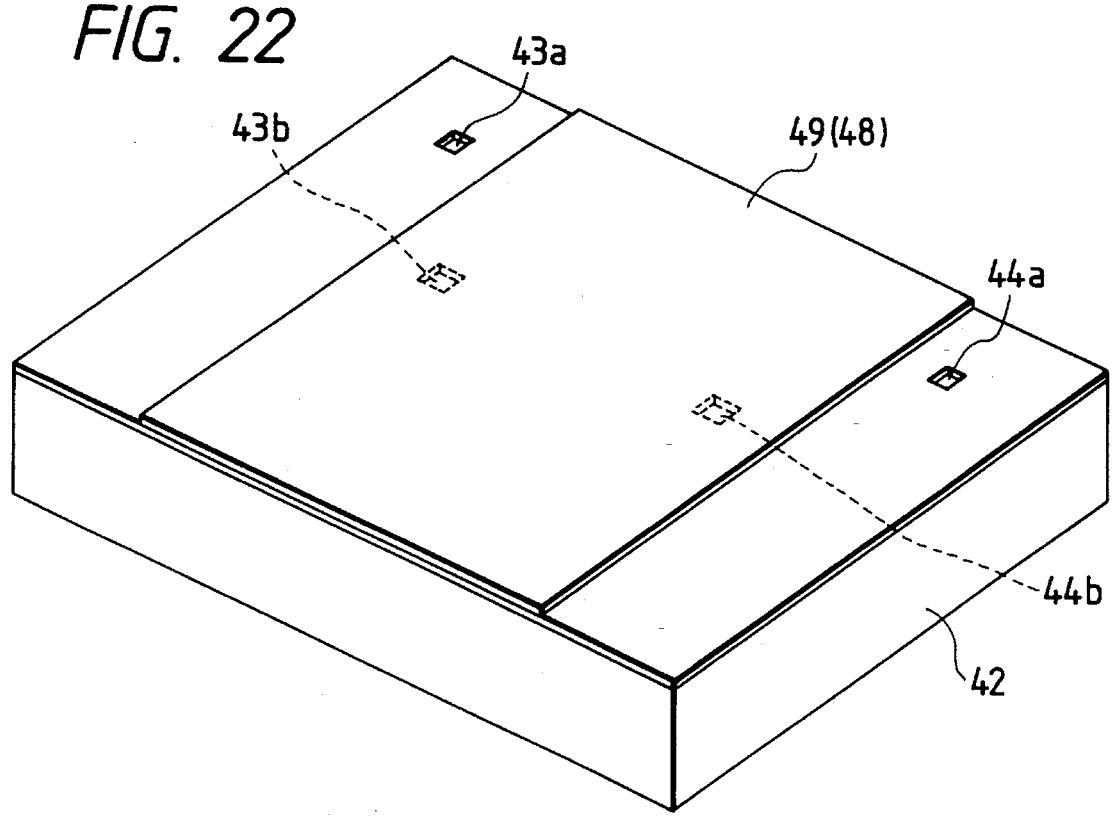
FIG. 22 is a perspective view illustrating a state in which a first conductor film and a dielectric film are formed on the second interlayer insulation film.
Figure 23:
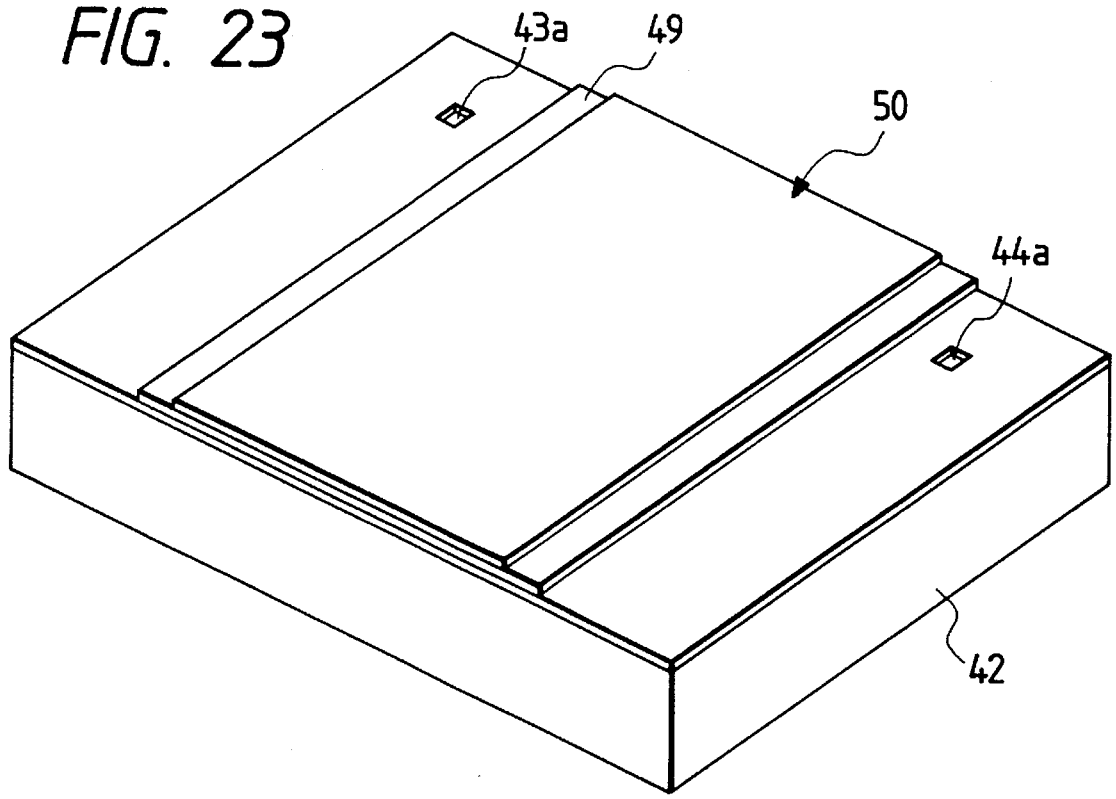
FIG. 23 is a perspective view illustrating a state in which a second conductor film is formed on the dielectric film.

Thus, as shown in FIG. 22, a first conductor film 48 for conducting the terminal portion 43b for the coils 43 with the terminal portion 44b for the coils 44, as well as a dielectric film ($Ta_2O_5$) 49 laminated thereon are formed.

Formation of Second Conductor Film

Then, the substrate is set to a sputtering device and a Cr film of 500 angstrom thickness and a Cu film of 2,000 angstrom thickness are formed continuously and then a second conductor film 50 covering the dielectric film 40 is formed by the same step as that shown in FIG. 12.

Formation of Third Interlayer Insulator Film

Figure 24:
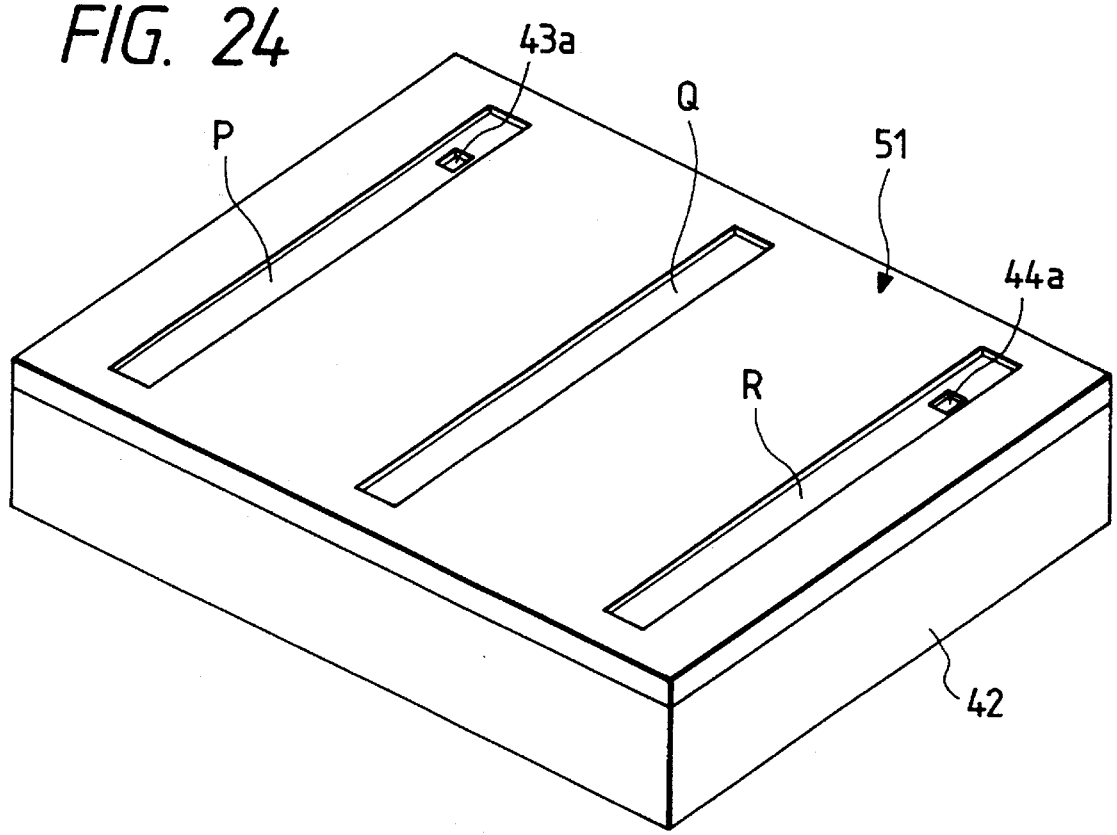
FIG. 24 is a perspective view illustrating a state in which third interlayer insulation film is formed.
Figure 25:
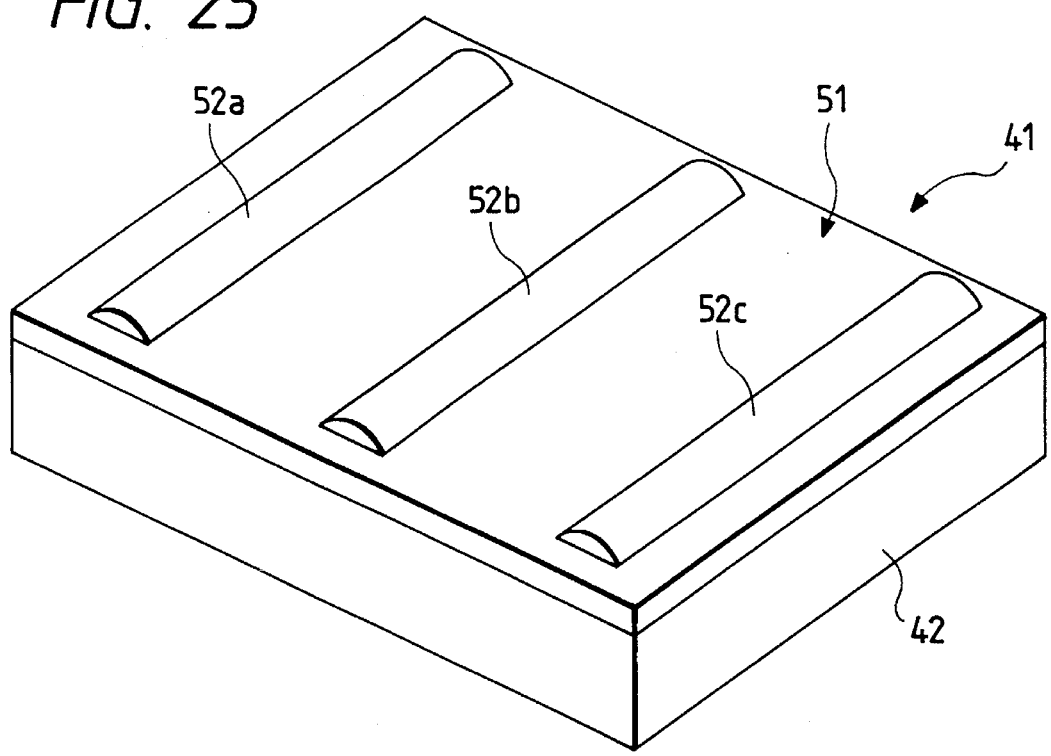
FIG. 25 is a perspective view illustrating a state in which a bump electrodes are formed.

Subsequently, in the same procedures as the step for forming the interlayer insulation film described above, a third interlayer insulation film 51 is formed as shown in FIG. 24. The film is formed over a range including an entire region of the substrate excepting for elongate portions P, Q, R shown in FIG. 24.

Formation of Bump Electrode

Figure 7:
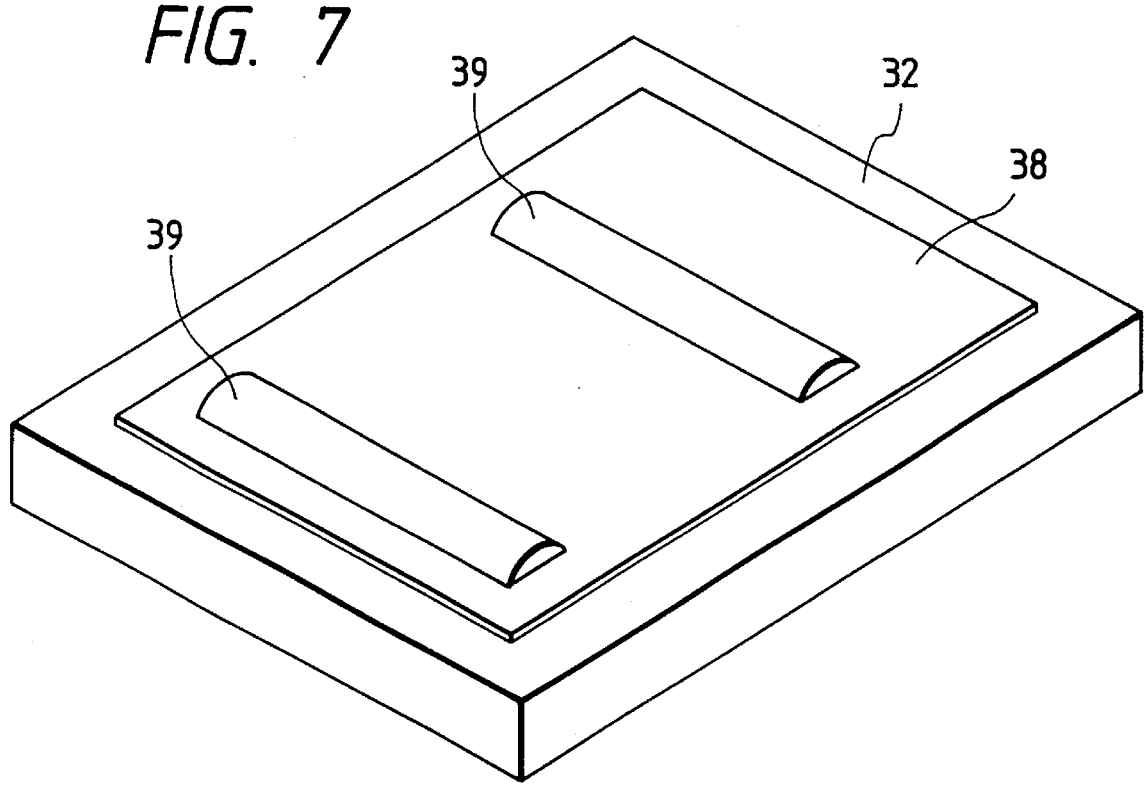
FIG. 7 is a perspective view illustrating a state in which bump electrodes are formed.

Then, by the same step as that shown in FIG. 7, bump electrodes 52, 52b, 52c are formed. The bump electrode 52a is connected with the terminal portion 43a of the coils 43, the bump electrode 52b is connected with the second conductor film 50, and the bump electrode 52c is connected with the terminal portion 44a of the coils 44.

The thin film device 41 having the above-mentioned constitution has an outer profile size of 1.6 mm×0.8 mm and has a cut-off frequency of 1 MHz. On the contrary, the thin film chip L-C filter of the prior art shown in FIG. 2 has an outer profile size of 2.7 mm×4.1 mm and a cut-off frequency of 100 MHz.

As has been described above, according to the present invention, a thin film chip L-C filter having a size about 12% of the prior art and capable of operating at a low frequency band can be obtained as shown by the previous embodiments.

Figure 26:
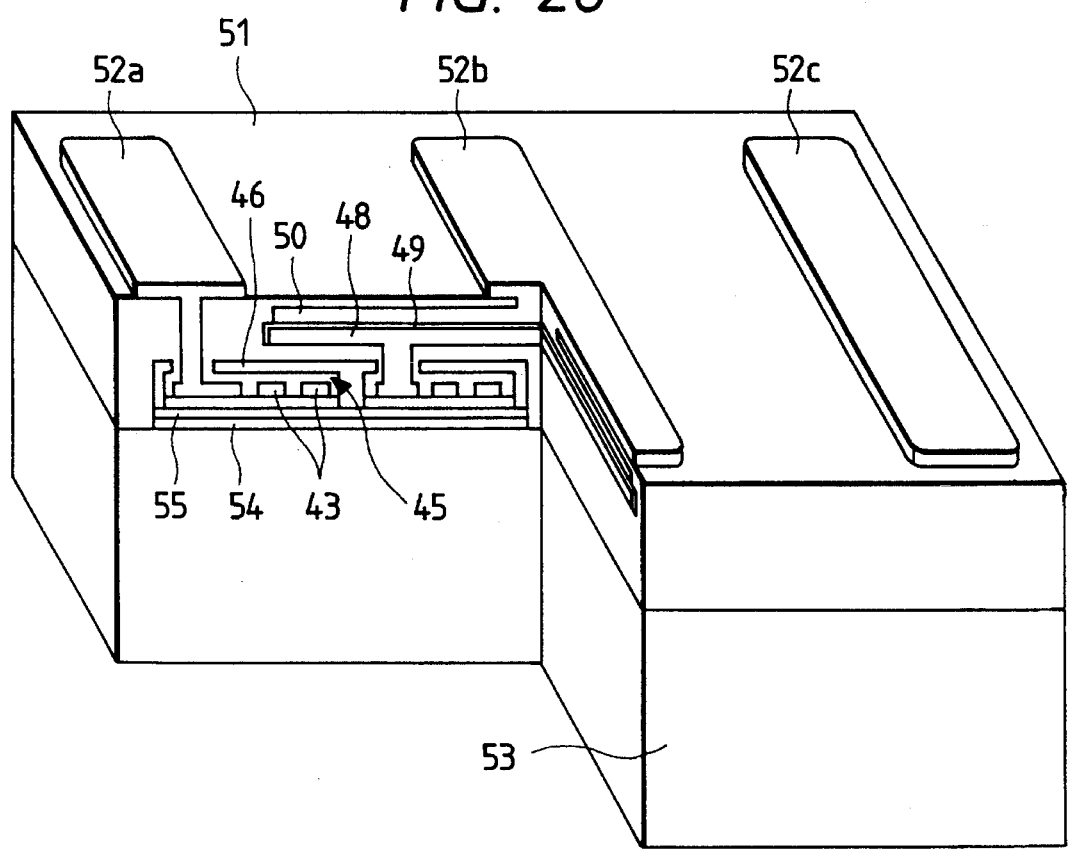
FIG. 26 is a perspective view partially in cross section illustrating a modified embodiment of a thin film device according to the third aspect of the present invention.

Further, in the embodiment shown in FIG. 16, a magnetic material with no insulation property and having an insulation film formed on the surface thereof can also be used as the substrate. Further, a non-magnetic substrate having a magnetic film formed on the surface and an insulation film further formed on the surface of the magnetic film can also be used as the substrate 42. FIG. 26 shows an example.

In the thin film device shown in FIG. 26, a bottom insulation film 54 is formed on a silicon substrate 53, on which a bottom magnetic film 55 made of a crystallite material comprising $Fe_{78}Ta_{10}C_{12}$ is formed. The coils 43 and 44 are formed on the bottom magnetic film 55 and other films are also formed. Then, the bottom magnetic film 54 is conducted with the magnetic film 46 to cover the upper and the lower surfaces of the coils 43 and 44 with the $Fe_{78}Ta_{10}C_{12}$ material.

As has been described above according to the present invention, in an inductor, a distributed constant type L-C device, a lumped type L-C device, the inductance value can be increased and the circuit operation frequency can be lowered in a case of L-C device by using, for example, a crystallite material such as $Fe_{78}Ta_{10}C_{12}$ as the magnetic film. In addition, since the inductance value is increased although the magnetic film is of a small area, a small sized thin film device can be formed.

What is claimed is:

1. A noise filter comprising:

a substrate, a coil layer formed in a spiral planar configuration on the substrate, the coil layer having ends, a magnetic film formed by way of an insulation layer on the coil layer such that the ends are exposed, and terminal portions formed to contact the exposed ends of the coil layer, wherein the magnetic layer comprises an Fe-M-C system crystallite material in which Fe represents iron, M represents a metal belonging to the periodic group IVb, Vb or VIb and C represents carbon.

2. A noise filter comprising:

a substrate, a coil layer formed in a spiral planar configuration on the substrate, the coil layer having ends, a dielectric layer formed on the coil layer, a conductor layer formed on the dielectric layer, a magnetic film formed by way of an insulation layer on the conductor layer, and terminal portions formed to contact the ends of the coil layer and the conductor layer through openings in the magnetic film and the dielectric layer, wherein the magnetic layer comprises an Fe-M-C system crystallite material in which Fe represents iron, M represents a metal belonging to the periodic group IVb, Vb or VIb and C represents carbon.

3. A noise filter comprising:

a substrate, a coil layer formed in a spiral planar configuration on the substrate, the coil layer having ends, a magnetic layer formed by way of an insulation layer on the coil layer such that the ends are exposed, a first conductor layer formed by way of an insulation layer on the magnetic layer and in electrical contact with the coil layer, a second conductor layer formed by way of a dielectric layer on the first conductor layer, and terminal portions formed to contact the ends of the coil layer and the second conductor layer, wherein the magnetic layer comprises an Fe-M-C system crystallite material in which Fe represents iron, M represents a metal belonging to the periodic group IVb, Vb or VIb and C represents carbon.

* * * * *